(12) United States Patent
Iwamoto et al.

(10) Patent No.: US 7,276,992 B2
(45) Date of Patent: Oct. 2, 2007

(54) ANTENNA DUPLEXER AND ELECTRONIC DEVICE

(75) Inventors: Yasuhide Iwamoto, Kawasaki (JP); Shogo Inoue, Kawasaki (JP); Jun Tsutsumi, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 134 days.

(21) Appl. No.: 11/114,090

(22) Filed: Apr. 26, 2005

(65) Prior Publication Data

US 2005/0237130 A1    Oct. 27, 2005

(30) Foreign Application Priority Data

Apr. 27, 2004    (JP)    ............................. 2004-132126

(51) Int. Cl.
*H03H 9/72* (2006.01)
(52) U.S. Cl. ...................................... 333/133; 333/193
(58) Field of Classification Search ................. 333/133
See application file for complete search history.

(56) References Cited

U.S. PATENT DOCUMENTS 5,561,406 A * 10/1996 Ikata et al. ................. 333/126
6,501,344 B2 * 12/2002 Ikata et al. ................. 333/133
7,053,731 B2 * 5/2006 Iwamoto et al. ............ 333/133
2003/0090338 A1 * 5/2003 Muramatsu ................. 333/133
2005/0206477 A1 * 9/2005 Cheema et al. ............. 333/133

FOREIGN PATENT DOCUMENTS

| JP | 4-103209 A | 4/1992 |
| JP | 6-97761 A | 4/1994 |
| JP | 8-18393 | 1/1996 |
| JP | 10-75153 | 3/1998 |
| JP | 10-126213 | 5/1998 |
| JP | 11-340781 | * 12/1999 |
| JP | 2001-339273 | 12/2001 |
| JP | 2003-198325 A | 7/2003 |
| JP | 2005-39407 | * 2/2005 |

\* cited by examiner

*Primary Examiner*—Barbara Summons
(74) *Attorney, Agent, or Firm*—Arent Fox, LLP.

(57) ABSTRACT

An antenna duplexer includes two surface acoustic wave filters having different center frequencies and a phase matching circuit that matches phases of the two surface acoustic wave filters. A matching line pattern is provided on at least two layers between the two surface acoustic wave filters and transmission and reception terminals, and within an area specified by a sheet-like ground in a multilayered package, the multilayered package comprising multiple layers including a bonding layer on which wire bonding pads are provided for connecting to the two surface acoustic wave filters, and the matching line pattern having no portion provided on bonding layer.

15 Claims, 18 Drawing Sheets

FIG. 1    -- PRIOR ART --
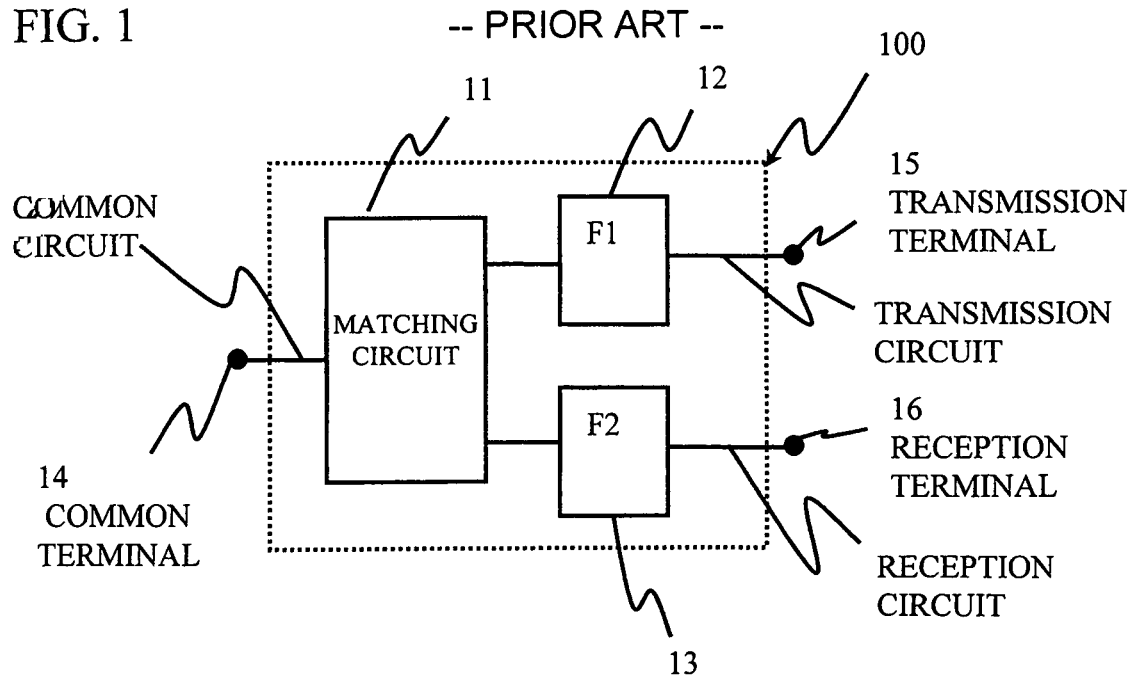
FIG. 2    -- PRIOR ART --
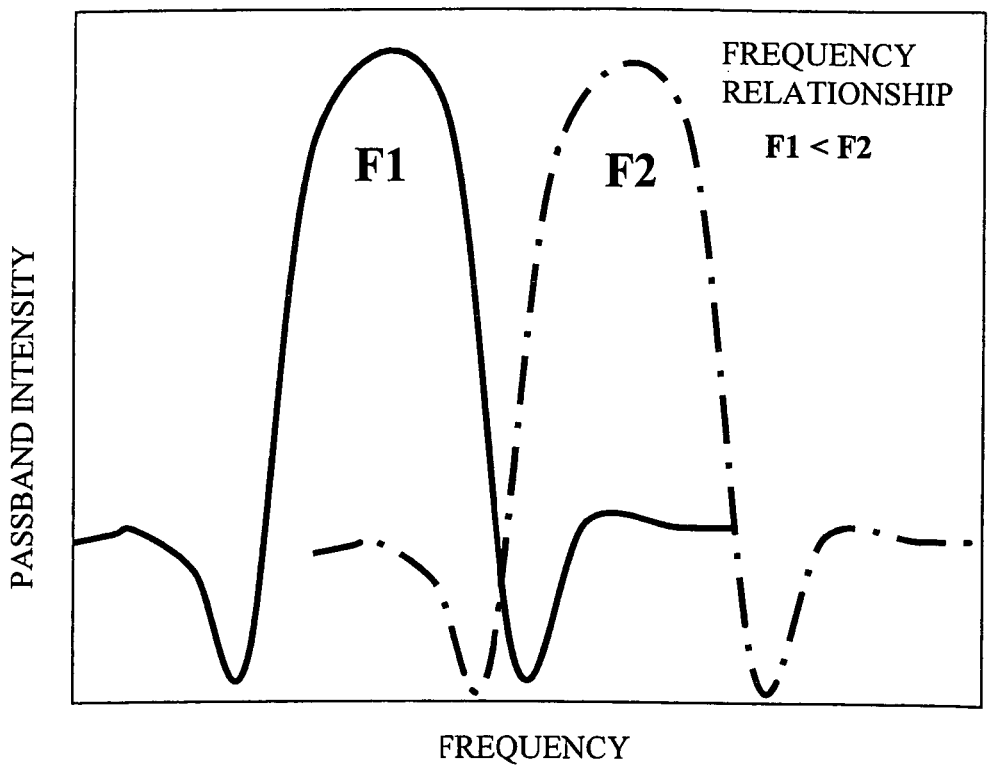

FIG. 5A  FIG. 5B  FIG. 5C  FIG. 5D  FIG. 5E
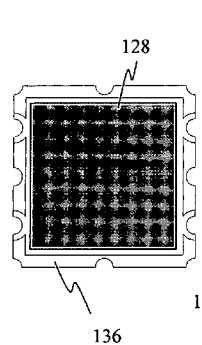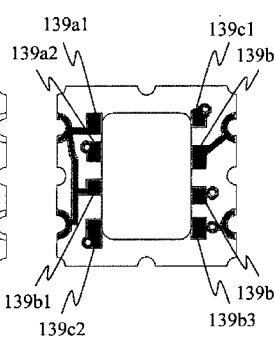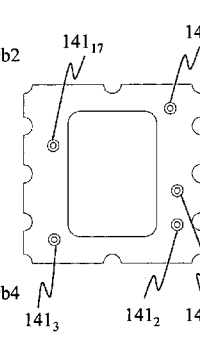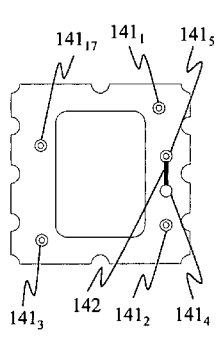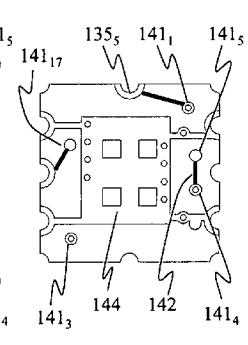
FIG. 5F  FIG. 5G  FIG. 5H  FIG. 5I
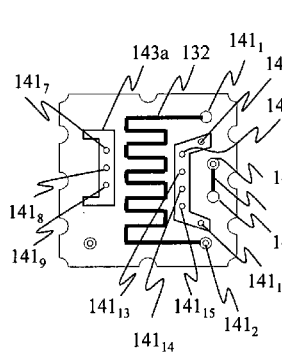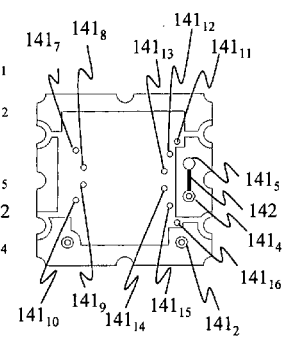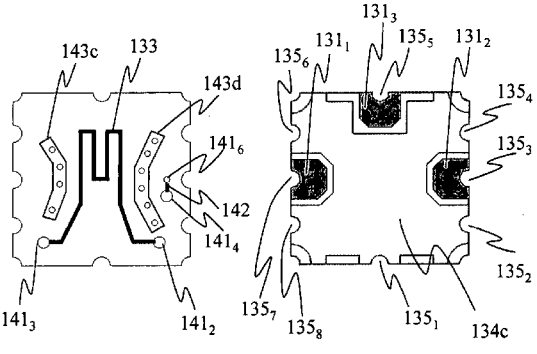

a: MATCHING LINE PATTERN IS NOT PROVIDED ON BONDING PAD LAYER
b: MACTHING LINE PATTERN IS PROVIDED ON BONDING PAD LAYER a: HAVING GROUND PATTERN
b: NOT HAVING GROUND PATTERN a: HAVING GROUND PATTERN AND GROUND VIA
b: HAVING GROUND PATTERN a: GROUND FOR TRANSMISSION AND GROUND FOR RECEPTION IS CONNECTED ON BONDING PAD LAYER b: GROUND FOR TRANSMISSION AND GROUND FOR RECEPTION IS NOT CONNECTED ON BONDING PAD LAYER

UPPER GROUND DISTANCE (D1) AND LOWER GROUND DISTANCE (D2) ARE DIFFERENT.

(TOTAL DISTANCE OF UPPER GROUND DISTANCE (D1) AND LOWER GROUND DISTANCE (D2) IS CONSTANT)

UPPER GROUND DISTANCE (D1) IS ENLARGED.

(LOWER GROUND DISTANCE (D2) IS CONSTANT)

LOWER GROUND DISTANCE (D2) IS SHORTENED.

(UPPER GROUND DISTANCE (D1) IS CONSTANT)

FIRST MATCHING LINE PATTERN

SECOND MACTHING LINE PATTERN

FIRST MATCHING LINE PATTERN IS LONGER THAN
SECOND MATCHING LINE PATTERN a: SHEET GROUND IS PROVIDED BETWEEN MATCHING LINE PATTERNS
b: SHEET GROUND IS NOT PROVIDED BETWEEN MATCHING LINE PATTERNS

ANTENNA DUPLEXER AND ELECTRONIC DEVICE

BACKGROUND OF THE INVENTION

1. Field of the Invention

This invention generally relates to antenna duplexers having surface acoustic wave filters and electronic devices employing the antenna duplexers.

2. Description of the Related Art

In these years, mobile telephones and mobile information terminals have been widespread rapidly along with the advancements in mobile communication systems. Competitive races among manufactures are intense on downsizing and high performance thereof. A mobile telephone employs both analogue and digital networks, and the frequency bands are wide-ranging, for example, 800 MHz to 1 GHz or 1.5 GHz to 2.0 GHz. An antenna duplexer (or simply referred to as duplexer) having a surface acoustic wave (hereinafter referred to as SAW) filter has been proposed for use in a mobile communication device.

A mobile telephone employs dual mode or dual band so as to be more sophisticated and respond to the diversified communication systems under the development environment these years. The dual mode refers to the use of both analog and digital networks such as TDMA (Time Division Multiple Access) and CDMA (Code Division Multiple Access). The dual band refers to the use of both 800 MHz and 1.9 GHz frequency bands, or 900 MHz and 1.8 GHz or 1.5 GHz frequency bands. Several developments have been carried out to produce more advanced parts including a filter to be used in the mobile telephone.

Meanwhile, a mobile terminal is demanded to be smaller in size and lower in price. The sophisticated duplexer is, in most cases, a dielectric duplexer (composed of dielectric materials only), a combination of a dielectric material and a SAW device, or a SAW duplexer (composed of SAW devices only).

The dielectric duplexer is large in size, and it is hard to downsize and reduce the thickness of the mobile terminal, when it is mounted on the mobile terminal. Even if the duplexer including the SAW device is employed, dielectric material and makes it impossible to downsize and reduce the thickness of the whole duplexer. One SAW duplexer is a module type and includes the conventional SAW filters. The SAW filters and a matching circuit are mounted on the printed board. Another SAW duplexer is an integrated type and includes a multilayered ceramic package having SAW filter chips for signal transmission and reception mounted thereon.

The SAW duplexer has a volume of ⅓ to 1/15 that of the dielectric duplexer, and can be downsized and reduced the height by almost ½ to ⅓. With thus downsized SAW duplexer, the cost can be lowered to be almost same as that of the dielectric duplexer.

A description will now be given of a conventional duplexer. FIG. 1 is a structural block diagram of the conventional duplexer. FIG. 2 is a graph showing frequency characteristics of the conventional duplexer. The horizontal axis in FIG. 2 denotes frequency. The frequency becomes higher to the right. The vertical axis in FIG. 2 denotes passband intensity. The passband intensity becomes higher to the top. Referring to FIG. 1, a duplexer 100 includes an impedance matching circuit (or simply referred to as matching circuit) 11, two SAW filters 12 and 13, a common terminal 14, a transmission terminal 15, and a reception terminal 16.

The common terminal 14 is connected to an external circuit that transmits and receives an electric wave through an antenna. The transmission terminal 15 is connected to another external circuit for signal transmission and outputs a signal having a desired center frequency. The reception terminal 16 is connected to an external circuit for signal reception and inputs the signal having the desired center frequency. Terminals paired with the transmission terminal 15 and the reception terminal 16 are respectively grounded.

Generally, the impedance matching circuit 11 and the SAW filters 12 and 13 are included in the multilayered ceramic package. The SAW filters 12 and 13 have different center frequencies. The SAW filter 12 has a passband center frequency F1, and the SAW filter 13 has a passband center frequency F2. Here, F2 >F1. The SAW filter 12 is a filter for signal transmission, and the SAW filter 13 is a filter for signal reception. Therefore, the SAW filter 12 is referred to as a transmission filter 12, and the SAW filter 13 is referred to as a reception filter 13. For example, the duplexer of 1.9 GHz range has a difference of 100 MHz in frequency between F1 and F2.

The matching circuit 11 is provided not to degrade the filter characteristics of the filters 12 and 13. Z1 is a characteristic impedance in viewing the SAW filter 12 from the common terminal 14. Z2 is a characteristic impedance in viewing the SAW filter 13 from the common terminal 14. If a signal having the frequency F1 is input from the common terminal 14 due to the function of the matching circuit 11, the characteristic impedance of the common terminal 14 corresponds to the characteristic impedance Z1 of the SAW filter 12, the characteristic impedance Z2 of the SAW filter 13 is infinite, and a reflection coefficient thereof is 1. If a signal having the frequency F2 is input from the common terminal 14 due to the function of the matching circuit 11, the characteristic impedance of the common terminal 14 corresponds to the characteristic impedance Z2 of the SAW filter 13, the characteristic impedance Z1 of the SAW filter 12 is infinite and a reflection coefficient thereof is 1.

A description will now be given of the conventional technique for downsizing the duplexer. Japanese Patent Application Publication No. 10-126213 (hereinafter referred to as Document 1) proposes a configuration of the duplexer that employs the multilayered ceramic package. Document 1 also proposes that the matching line pattern is provided on two layers for matching the phases. Japanese Patent Application Publication No. 8-18393 (hereinafter referred to as Document 2) also proposes that the matching line pattern is provided on two layers. Japanese Patent Application Publication No. 10-75153 (hereinafter referred to as Document 3) proposes that multiple matching line patterns are provided on two layers. Japanese Patent Application Publication No. 2001-339273 (hereinafter referred to as Document 4) proposes that multiple matching line patterns are provided in a circumferential region of the chip.

Document 1 employs the structure of the multiple ceramic packages. However, the chip is connected with wires. This causes a drawback in downsizing. Additionally, the matching circuits are respectively required for the two SAW filters, when the duplexer employs the package with which the SAW filters are hermetically sealed.

Document 1 and Document 2 describe that the matching line patterns are provided on two layers. However, the matching line patterns are provided on the antenna terminal only. No consideration is given to the matching line on the transmission terminal or reception terminal. This is because the duplexers of Document 1 and Document 2 are designed for 800 MHz band, which is not very much affected from a parasite impedance as compared to the affect from 2 GHz band. There is a problem in that a mismatch of the filters cannot be adjusted in the high-frequency duplexer such as 2 GHz band especially.

Document 3 describes that the multiple matching line patterns are provided for phase matching. However, on the transmission terminal or reception terminal, no portion of the matching line pattern is provided on two layers. There is the same problem in that the mismatch of the filters cannot be adjusted in the high-frequency duplexer such as 2 GHz range especially.

Document 4 describes that multiple matching line patterns are provided in the circumferential region of the chip. There arises a problem in that the package size is large and it is hard to be downsized.

SUMMARY OF THE INVENTION

It is a general object of the present invention to provide a small-sized duplexer having stable characteristics and en electronic device having the duplexer.

According to an aspect of the present invention, preferably, there is provided an antenna duplexer including two surface acoustic wave filters having different center frequencies, and a phase matching circuit that matches phases of the two surface acoustic wave filters. A matching line pattern is provided on at least two layers between the two surface acoustic wave filters and transmission and reception terminals, and within an area specified by a sheet-like ground in a multilayered package, the multilayered package comprising multiple layers including a bonding layer on which wire bonding pads are provided for connecting to the two surface acoustic wave filters, and the matching line pattern having no portion provided on bonding layer.

According to another aspect of the present invention, preferably, there is provided an antenna duplexer including two surface acoustic wave filters having different center frequencies, and a phase matching circuit that matches phases of the two surface acoustic wave filters. A ground pattern is provided between a matching line pattern for signal transmission and the phase matching circuit and/or between the matching line pattern for signal reception and the phase matching circuit.

According to another aspect of the present invention, preferably, there is provided an antenna duplexer including a first and a second surface acoustic wave filters having different center frequencies, and a phase matching circuit that matches phases of the two surface acoustic wave filters, a ground of the first and second surface acoustic wave filters provided on a bonding layer being connected on the bonding layer.

According to another aspect of the present invention, preferably, there is provided an antenna duplexer including a first and a second surface acoustic wave filters having different center frequencies, a phase matching circuit that matches phases of the two surface acoustic wave filters; and a multilayered package. The multilayered package comprises a first pattern layer, a second pattern layer, a first ground layer, a second ground layer, and a third ground layer, the first pattern layer having thereon a first matching line pattern that forms the phase matching circuit, the second pattern layer having thereon a second matching line pattern that forms the phase matching circuit and being arranged below the first pattern layer, the first ground layer being arranged above the first pattern layer, the second ground layer being arranged between the first and the second pattern layers, the third ground layer being arranged below the second pattern layer. The first through the third ground layers respectively have ground patterns thereon, and a first distance between the ground pattern on the first ground layer and the ground pattern on the second ground layer is longer than a second distance between the ground pattern on the second ground layer and the ground pattern on the third ground layer.

According to another aspect of the present invention, preferably, there is provided an antenna duplexer including a first and a second surface acoustic wave filters having different center frequencies, and a phase matching circuit that matches phases of the two surface acoustic wave filters. A multilayered package comprises a first pattern layer, a second pattern layer, a first ground layer, a second ground layer, and a third ground layer, the first pattern layer having thereon a first matching line pattern that forms the phase matching circuit, the second pattern layer having thereon a second matching line pattern that forms the phase matching circuit and being arranged below the first pattern layer, the first ground layer being arranged above the first pattern layer, the second ground layer being arranged between the first and the second pattern layers, the third ground layer being arranged below the second pattern layer. The first through the third ground layers respectively have ground patterns thereon; and the first matching line pattern is longer than the second matching line pattern.

According to another aspect of the present invention, preferably, there is provided an electronic device including an antenna, an antenna duplexer connected to the antenna, circuits for signal transmission and reception connected to the antenna duplexer, the antenna duplexer being one of the above-mentioned antenna duplexer of the present invention.

BRIEF DESCRIPTION OF THE DRAWINGS

Preferred embodiments of the present invention will be described in detail with reference to the following drawings, wherein:

FIG. 1 is a structural block diagram of a conventional duplexer;

FIG. 2 is a graph showing frequency characteristics of the conventional duplexer;

FIGS. 5A through 5I show respective layers of a laminated package in the duplexer shown in FIG. 3;

DESCRIPTION OF THE PREFERRED EMBODIMENTS

Figure 3:
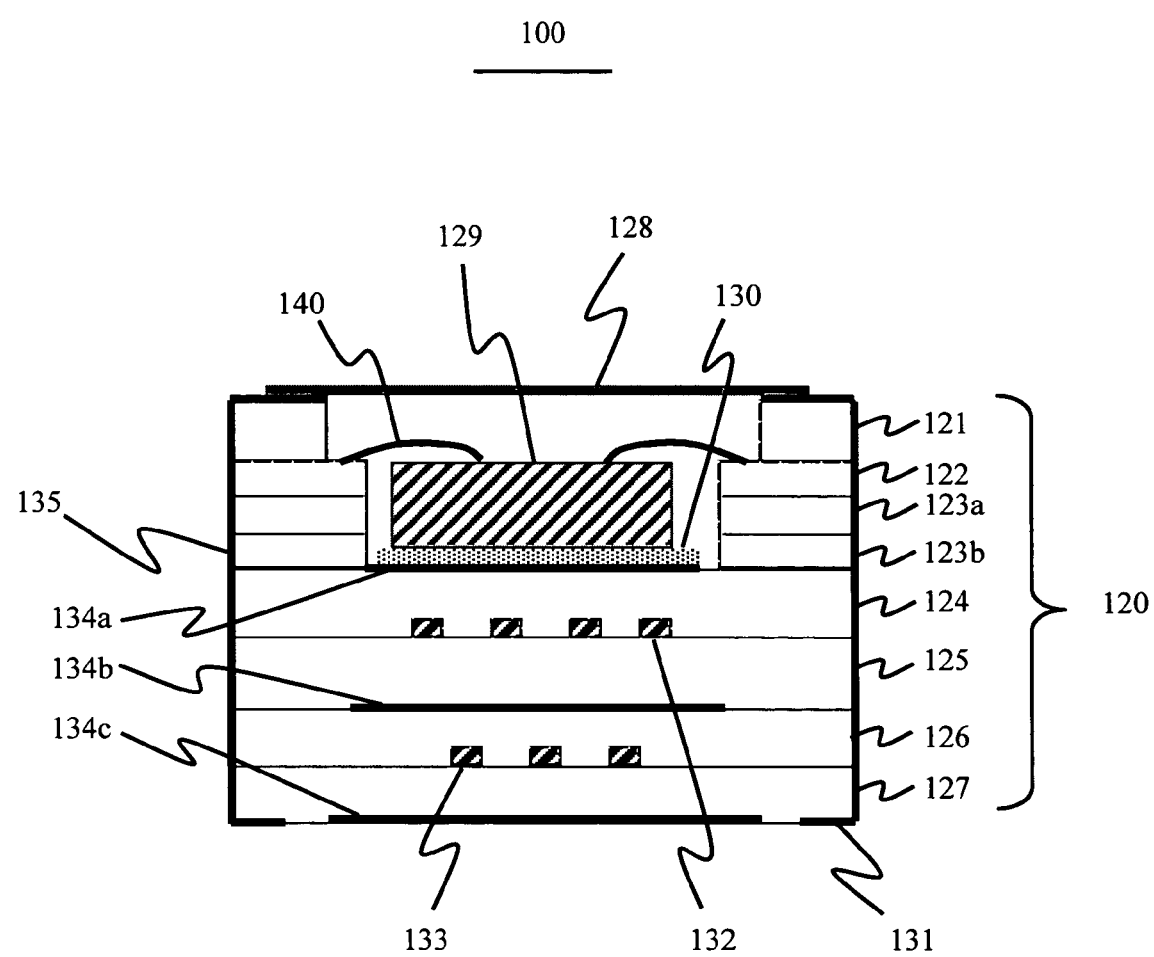
FIG. 3 is a duplexer in accordance with an embodiment of the present invention.

A description will now be given of two comparative duplexers in order to facilitate the better understanding of the present invention. The first comparative duplexer is intended to downsize the package. This duplexer has line patterns provided on two layers for phase matching. The matching line patterns are elongated to increase the phase rotations. This can improve the matching in the passband and the insertion loss.

With this configuration, the line for phase matching is provided on a wire bonding pad layer and on a cavity layer arranged immediately below the wire bonding pad layer. If the package size is approximately 5 mm×5 mm, the distances between the interconnection patterns for transmitting signals can be separate to retain a sufficient suppression. However, if the interconnection patterns for signal transmission is provided on the wire bonding pad layer (which will sometimes be referred to as a bonding layer) in a package downsized to 3 mm×3 mm, it will become hard to maintain the isolation between signals. This causes a problem in that a sufficient suppression is not obtainable. Besides, the distance becomes closer between the matching line pattern serving as a phase matching circuit and the matching line pattern for signal transmission. Moreover, the distance also becomes closer between the matching line pattern serving as the phase matching circuit and the matching line pattern for signal reception. It is hard to retain the isolation between the patterns. Thus, it is impossible to obtain the sufficient suppression.

The other comparative duplexer has a first line pattern for phase matching provided on an upper layer and a second line pattern for phase matching provided on a lower layer. The distance between the ground and the first matching line pattern is small on the upper layer, and the second matching line pattern is long on the lower layer. The duplexer thus configured has a space enough to provide the matching line pattern in a package having a size of approximately 5 mm×5 mm. The matching line pattern rarely forms a self-connection, and a problem does not arise especially. If the duplexer utilizes 800 MHz band, it is capable of configuring "comb-like electrodes" having sufficient cross-sectional areas in a SAW resonator. No problem will arise in power durability.

Then, if the package is downsized to approximately 3 mm×3 mm, there is not an enough space so as to provide the matching line patterns. So, the distance has to become narrower between the matching line patterns. As a result, the matching line pattern forms the self-connection, and reflection characteristics in the transmission band become small, due to the reflection characteristics viewing from the common terminal of the reception filter. In this state, the current is leaked to the reception signal when the transmission signal is applied to the common terminal, and this causes a problem in that the reception filter is damaged and the power durability is degraded. In addition, the cross-sectional areas of "the comb-like electrodes" have to be narrowed considerably in the duplexer of 2 GHz band. There also arises a problem in that the degradation of the power durability cannot be avoided unless the reflection characteristics are enhanced as compared to those of 800 MHz band.

The structural block diagram and the fundamental frequency characteristics of the device in accordance with the present invention are the same as those in FIGS. 1 and 2. Thus, a description will be omitted.

A description will now be given, with reference to the accompanying drawings, of embodiments of the present invention.

Figure 4:
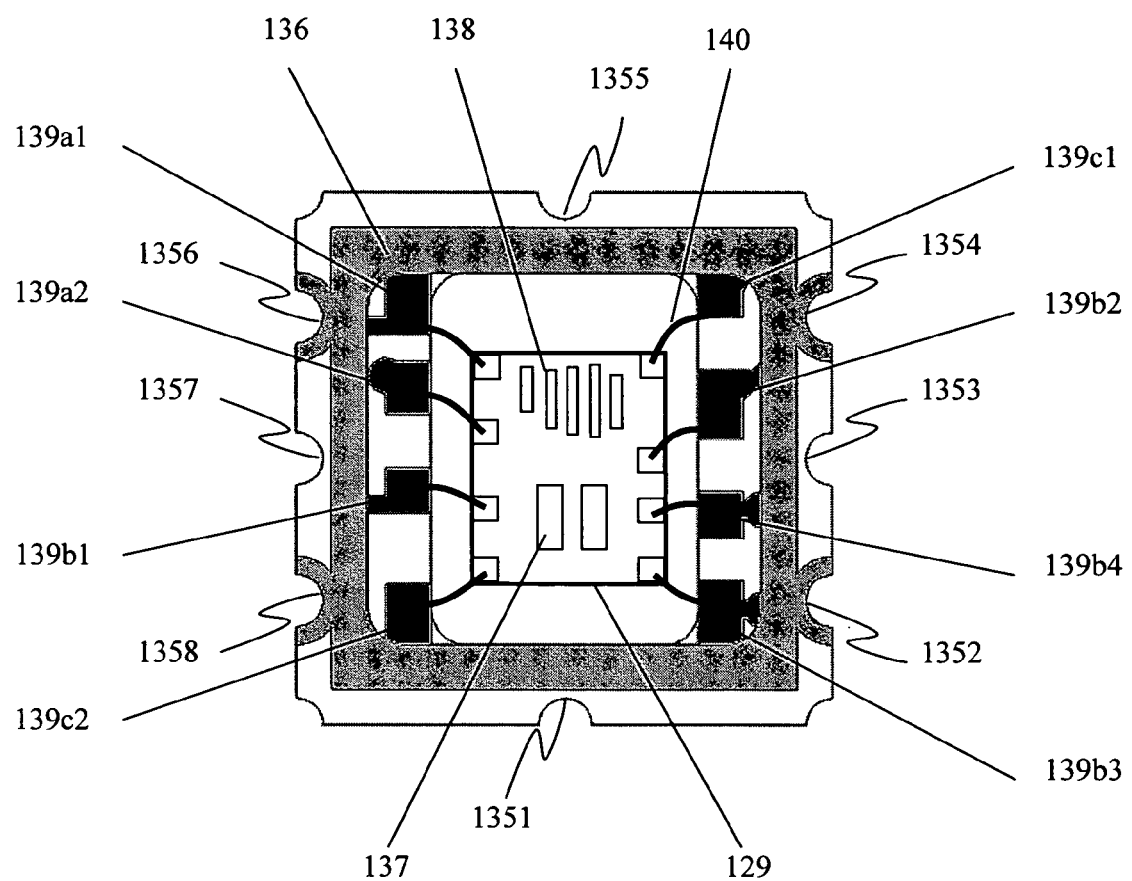
FIG. 4 is a top view of the duplexer when a cap is removed.

FIG. 3 shows a duplexer in accordance with an embodiment of the present invention, and is a cross-sectional view of a package having a filter chip mounted thereon. FIG. 4 is a top view of the duplexer when a cap is removed.

Referring to FIG. 3, a duplexer 100 includes a laminated package 120, a cap 128, a filter chip 129, a first matching line pattern 132, a second matching line pattern 133, and side castellations 135. The side castellations are also referred to as connection paths 135.

The laminated package 120 has a multilayered structure composed of eight layers 121 through 127. A layer 121 is a cap-mounting layer. A layer 122 is a wire bonding pad layer. A layer 123a is a first cavity layer and a layer 123b is a second cavity layer. A layer 124 is a die attach layer and also a ground layer. A layer 125 is a matching line pattern layer for phase matching (or simply a first pattern layer). A layer 126 is a ground layer. A layer 127 is another matching pattern line layer for phase matching/a footpad layer (or simply a second pattern layer).

Each of the layers 121 through 127 in the laminated package 120 is made of an alumina ceramic substance or glass ceramic substance having a dielectric constant (∈) of approximately 8-9.5. The size of the laminated package 120 is approximately 3 mm×3 mm×1.5 mm. Here, 1.5 mm denotes a height (thickness) of the package.

FIG. 4 schematically shows a SAW resonator. A transmission resonator 138 is a SAW resonator having the transmission filter 12. A transmission resonator 137 is a SAW resonator having the reception filter 13.

The filter chip 129 is a double-mode SAW filter having a ladder structure in which single-port SAW resonators are connected in a ladder. The filter chip 129 includes two filters 12 and 13 shown in FIG. 1. A piezoelectric substrate in the filter chip 129 may employ, for example, a piezoelectric single crystal such as $LiTaO_3$ (for example, 42 degrees Y-cut, X-propagation). The comb-like electrodes, resonators, and matching line patterns provided on the piezoelectric substrate may be made of conductive materials. For instance, an alloy having aluminum as a main component (such as Al—Cu, Al—Mg, or the like) and a multilayered film of aluminum (such as Al—Cu/Cu/Al—Cu, Al/Cu/Al, Al/Mg/Al, Al—Mg/Mg/Al—Mg, or the like) are formed by sputtering. Then, electrodes and interconnection patterns are formed by exposure and etching. An Ai—Si wire is used for connecting the package and the chip. The transmission filter 12 and the reception filter 13 may be formed on the respective piezoelectric substances separately.

The cap-mounting layer 121, the wire bonding pad layer 122, the first cavity layer 123a, and the second cavity layer 123b form a step region inside the package. The filter chip 129 is housed in a cavity made by the step region.

The cap 128 is attached on the cap-mounting layer 121. The cap 128 hermetically seals the filter chip 129. The cap 128 is made of a metal material such as Au plate or Ni plate. Grooves $135_1$ through $135_8$ having shapes of semicircles are provided on the sidewall of the laminated package 120. Those groves are provided from the cap-mounting layer 121 through the matching pattern line layer/the footpad layer 127. Conductive layers are provided on the grooves $135_1$ through $135_8$ to form the connection paths $135_1$ through $135_8$ (which may be referred to as the side castellation 135). The connection paths $135_1$ through $135_8$ are provided to establish interlayer conduction and serve as external connection terminals.

The die attach layer 124 is a chip-mounting surface for mounting the filter chip 129. The filter chip 129 is mounted on the die attach layer 124 with a conductive adhesive 130.

A first ground pattern 134a is provided on a top surface of the die attach layer 124. A second ground pattern 134b is provided on a top surface of the ground layer 126. A third ground pattern 134c is provided on the backside of the matching pattern line layer/the footpad layer 127. These ground patterns are sheet-shaped grounds (sheet-like grounds), and cover large parts of the respective layers. Hereinafter, these ground patterns 134a, 134b, and 134c are referred to as ground patterns 134.

The first matching line pattern 132 is formed on the matching line pattern layer 125. The second matching line pattern 133 is formed on the matching pattern line layer/the footpad layer 127. The aforementioned patterns form the phase matching circuit 11 shown in FIG. 1. Even if the first matching line pattern 132 and the second matching line pattern 133 are provided on two layers as described above and the package is thus downsized, a sufficient inductance is obtainable. The first matching line pattern 132 and the second matching line pattern 133 respectively have widths of, for example, 80 to 120 µm, and form a strip line structure (strip pattern) together with the ground pattern 134.

The first matching line pattern 132 and the second matching line pattern 133 are made of conductive-materials having a main component such as copper (Cu), silver (Ag), or tungsten (W). The first matching line pattern 132 and the second matching line pattern 133 respectively form conducting layers on the matching line pattern layer 125 and the matching pattern line layer/the footpad layer 127, and conducting films are patterned with a pattern printing.

Footpads 131 are external connection terminals, and are provided on the lowermost layer of the package. The footpads 131 correspond to the common terminal 14, the transmission terminal 15, and the reception terminal 16 shown in FIG. 1. The footpads 131 are coupled to an internal circuit of the duplexer through via holes formed on the side castellation 135 and inside the laminated package 120. The footpads 131 may include a food pad that is not be coupled to the internal circuit of the duplexer.

As shown in FIG. 4, when the cap 128 is removed, the filter chip 129, the cap-mounting layer 121, and a portion of the wire bonding pad layer 122 can be seen. A seal ring 136 is formed on the cap-mounting layer 121. The seal ring 136 is made of a conductive material in which Ni and Au are plated on Cu. The cap 128 is mounted on the seal ring 136. The wire bonding pad layer 122 includes a ground wire bonding pad 139a1 for transmission ground, a wire bonding pad 139a2 for signal transmission, three ground wire bonding pads 139b1, 139b2, and 139b3 for reception ground, a wire bonding pad 139b4 for signal reception, a wire bonding pad 139c1 serving as an inlet of the matching line pattern and a wire bonding pad 139c2 serving as an outlet of the matching line pattern. The aforementioned wire bonding pads are respectively connected to corresponding electrodes provided on the filter chip 129 by bonding wires 140. The strip line structure is formed between a metal ground of the seal ring 136 and a ground of an inner layer, or between the ground pattern of the bonding pad layer 122 and the ground pattern formed on the external connection terminal.

FIGS. 5A through 5I show respective layers of the laminated package 120 in the duplexer 100. FIG. 5A is the cap-mounting layer 121. FIG. 5B is the wire bonding pad layer 122. FIG. 5C is the first cavity layer 123a. FIG. 5D is the second cavity layer 123b. FIG. 5E is the die attach layer 124. FIG. 5F is the matching line pattern layer 125. FIG. 5G is the ground layer 126. FIG. 5H is a top surface of the matching pattern line layer/the footpad layer 127. FIG. 5I is a bottom surface of the matching pattern line layer/the footpad layer 127.

Figure 6D:
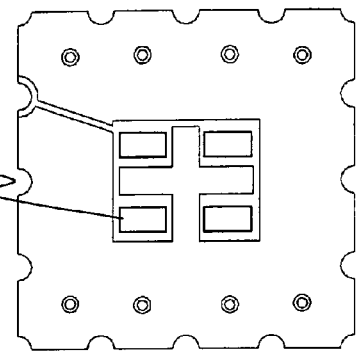
FIGS. 6A through 6G show the respective layers in the conventional duplexer so as to compare with those in the duplexer of the present invention.
Figure 6C:
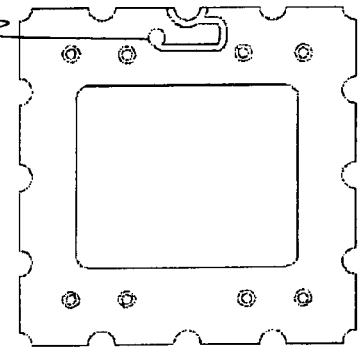
Figure 6B:
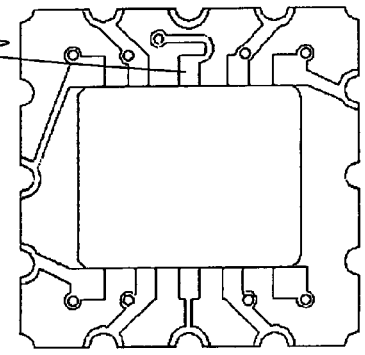
Figure 6A:
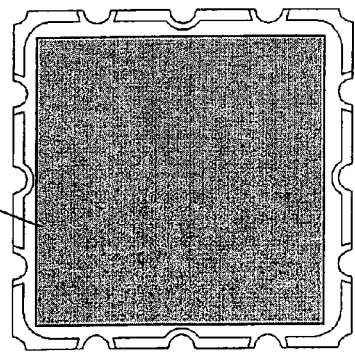
Figure 6G:
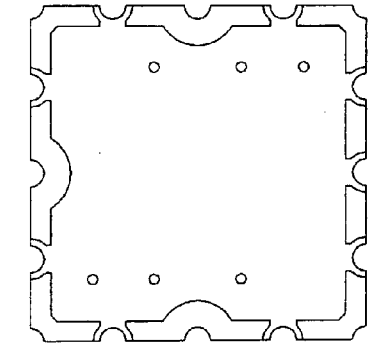
Figure 6F:
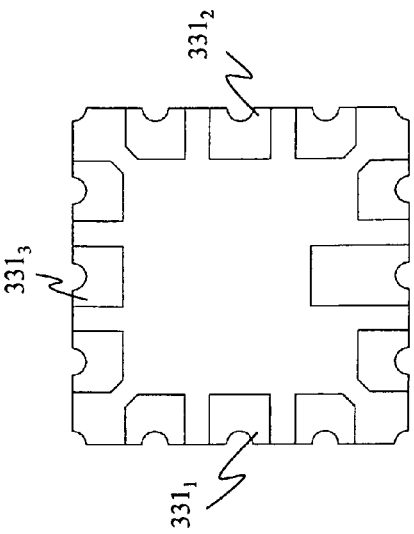
Figure 6E:
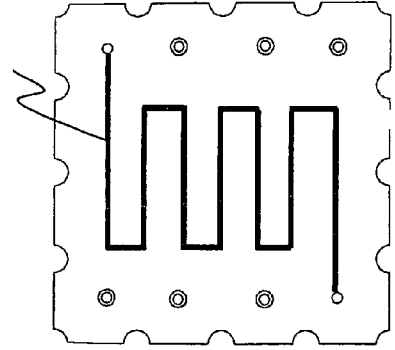

FIGS. 6A through 6G show the respective layers in the conventional duplexer so as to compare with those in the duplexer of the present invention. FIG. 6A shows a cap-mounting layer for mounting a cap 328. FIG. 6B shows a wire bonding pad layer. FIG. 6C shows a cavity layer. FIG. 6D shows a die attach layer having a die attach portion 344. FIG. 6E shows a matching line pattern layer for phase matching. FIG. 6F shows a top surface of a common ground/a footpad layer. FIG. 6G shows a bottom surface of the common ground/the footpad layer. With this configuration, a matching line pattern 332 provided on the matching line pattern layer (FIG. 6E) is also provided on the wire bonding pad layer (FIG. 6B) and the cavity layer (FIG. 6C). The cavity layer is arranged immediately below the wire bonding pad layer 322.

A description will now be given of the bottom surface of the matching pattern line layer/the footpad layer 127 shown in FIG. 5I. This bottom surface is a mounting surface of the duplexer 100. The mounting surface of the duplexer 100 is set on a circuit board (not shown) so as to mount the duplexer 100 on the circuit board. A footpad $131_1$ for signal transmission, a footpad $131_2$ for signal reception, and a footpad $131_3$ for the common terminal are formed on the mounting surface to be coupled to connection paths $135_7$, $135_3$, and $135_5$ respectively. Each footpad is also referred to as a foot castellation. The footpads $131_1$, $131_2$, and $131_3$ serve as external connection terminals, and are in touch with the corresponding electrodes on the circuit board to establish an electric connection. The footpad $131_1$ for signal transmission is the transmission terminal 15 in the duplexer 100 (refer to FIG. 1). The footpad $131_2$ for signal reception is the reception terminal 16 in the duplexer 100. The footpad $131_3$ for the common terminal is the common terminal 14 in the duplexer 100.

Referring back to FIG. 5B, the top surface of the wire bonding pad layer 122 includes the ground wire bonding pad 139a1 for signal transmission, the wire bonding pad 139a2 for signal transmission, the three ground wire bonding pads 139b1, 139b2, and 139b3 for signal reception, the wire bonding pad 139b4 for signal reception, the wire bonding pad 139c1 serving as the inlet of the matching line pattern, and the wire bonding pad 139c2 serving as the outlet of the matching line pattern. The ground wire bonding pad 139a1 for signal transmission (transmission ground) is connected to the ground wire bonding pad 139b1 for signal reception (reception ground). The above-mentioned pads are electrically coupled to the corresponding terminals in the filter chip 129 by the bonding wires.

One end of the first matching line pattern 132 provided on the matching line pattern layer 125 is connected to the connection path $135_5$ provided on the die attach layer 124 through a via $141_1$. The die attach layer 124 is provided immediately above the matching line pattern layer 125. The other end of the first matching line pattern 132 is passed through the ground layer 126 shown in FIG. 5G through a via $141_2$, and is extended to and provided on the matching pattern line layer/the footpad layer 127. The aforementioned other end of the first matching line pattern 132 is thus provided on the top surface of the matching pattern line layer/the footpad layer 127, and is further extended to the footpads 131 provided on the backside of the matching pattern line layer/the footpad layer 127 through a via $141_3$.

One end of a matching line pattern 142 for signal reception is connected to the wire bonding pad 139b4 for signal reception, which is provided on the wire bonding pad layer 122. The other end of the matching line pattern 142 is passed through the vias $141_4$ and $141_5$, and is sequentially provided on the first cavity layer 123a, the second cavity layer 123b, the die attach layer 124 having a die attach portion 144, the matching line pattern layer 125, the ground layer 126, and the matching pattern line layer/the footpad layer 127. The other end is further extended to the backside of the matching pattern line layer/the footpad layer 127 through a via $141_6$, and is connected to the footpad $131_2$ for signal reception.

The reception ground is used for the reception filter 13, and is connected to the seal ring 136 in FIG. 5A and the ground pattern 134c in FIG. 5I.

As shown in FIGS. 5F and 5H, preferably, the first matching line pattern 132 provided on the upper layer and the second matching line pattern 133 provided on the lower layer include a portion arranged at right angles to each other. This can prevent interference between the lines. The first matching line pattern 132 provided on the upper layer is configured to be longer than the second matching line pattern 133 provided on the lower layer. These pattern lengths can enlarge the reflection coefficient of a transmission band.

The seal ring (GND) 136 on the cap-mounting layer 121 shown in FIG. 5A is connected to the ground patterns 134a, 134b, and 134c through the connection paths $135_2$, $135_4$, $135_6$, and $135_8$.

Ground patterns 143a and 143b provided on the matching line pattern layer 125 are connected to ground patterns 143c and 143d provided on the matching pattern line layer/the footpad layer 127 through ground vias $141_7$ through $141_{16}$.

A description will be given of characteristic advantages of the duplexer of the present invention having the above-mentioned configuration.

Figure 7:
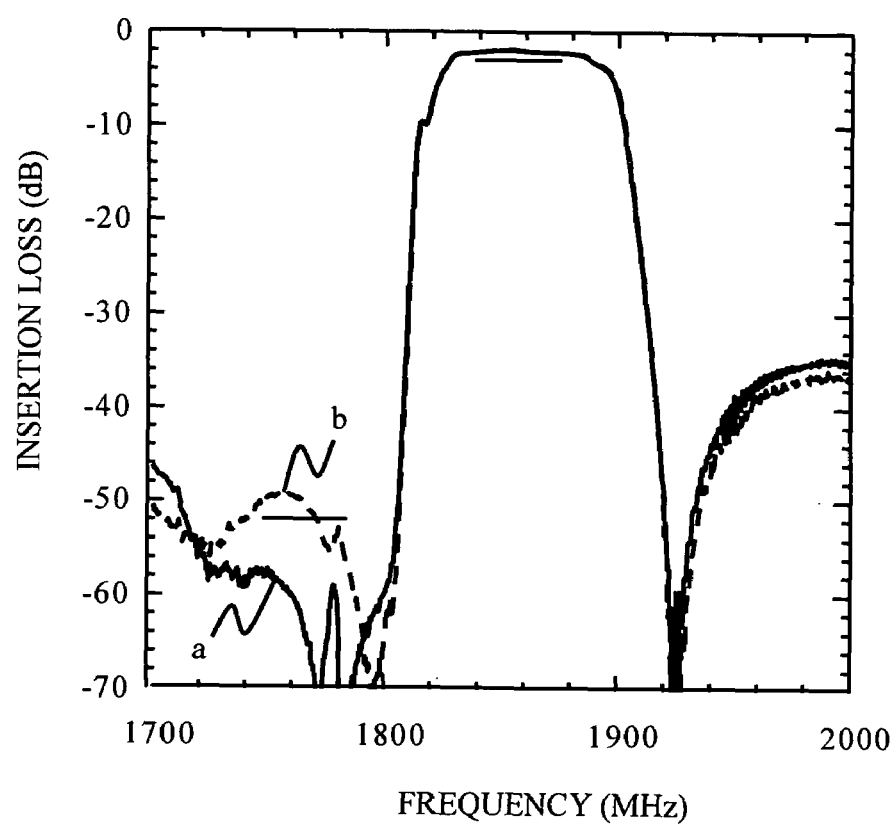
FIG. 7 shows a comparison of insertion loss characteristics between the duplexer of the present invention and the conventional duplexer.

FIG. 7 shows a comparison of insertion loss characteristics between the duplexer 100 of the present invention and the conventional duplexer. As shown in FIGS. 5A through 5I, the duplexer 100 is configured so that a portion of the matching line pattern is not provided on the wire bonding pad layer 122 (and on the first cavity layer 123a arranged immediately below the wire bonding pad layer 122). As shown in FIG. 6, the conventional duplexer is configured so that the matching line pattern is provided on the wire bonding pad layer 322 (and on the cavity layer 323 arranged immediately below the wire bonding pad layer 322).

The conventional matching line pattern is provided on multiple (at least two) layers including the wire bonding pad layer 322 and the cavity layer 323 arranged just below the wire bonding pad layer 322. In contrast, as shown in FIGS. 5D through 5H, the matching line pattern for signal reception is also provided on multiple (at least two) layers in a reception circuit ranging from the footpad $131_2$ for signal reception to the reception filter 13. However, the aforementioned matching line pattern for signal reception is designed not to be provided on the wire bonding pad layer 122 and on the first cavity layer 123a arranged just below the wire bonding pad layer 122. It is thus possible to enhance the isolation between the common circuit and the reception circuit. The common circuit corresponds to the matching line pattern. The reception circuit corresponds to the matching line pattern for signal reception.

The isolation is especially enhanced between the wire bonding pad 139c1 serving as the inlet of the matching line pattern and the matching line pattern for signal reception. In order to establish this isolation, it is effective that a portion of the matching line pattern for signal reception is not provided on the wire bonding pad layer 122 or on a layer (the first cavity layer 123a) arranged immediately below the wire bonding pad layer 122 (.

Referring back to FIG. 7, thus improved isolation is capable of improving the suppression. In particular, the suppression is remarkably improved on low frequency bands.

A downsized package does not have an enough space therein to arrange the matching line pattern for signal reception. For example, if the package size is reduced from 5 mm squire to 3 mm square, an area provided for the line pattern is reduced to 9/25. Moreover, a narrow space for providing the line pattern degrades the inductance due to the interference between the matching line patterns provided on different layers. This further degrades the characteristic impedance of the matching line pattern and also degrades the phase matching. The duplexer of the present invention shown in FIG. 5 has the matching line pattern for signal reception provided on three or more layers in the laminated body thereof. The duplexer of the present invention does not include the "sheet-like ground" for isolating the matching line patterns from each other. The characteristic impedance of the matching line pattern is not degraded, and the phase matching is improved. It is thus possible to improved the insertion loss and solve the above-mentioned problem in downsizing the package.

Figure 8:
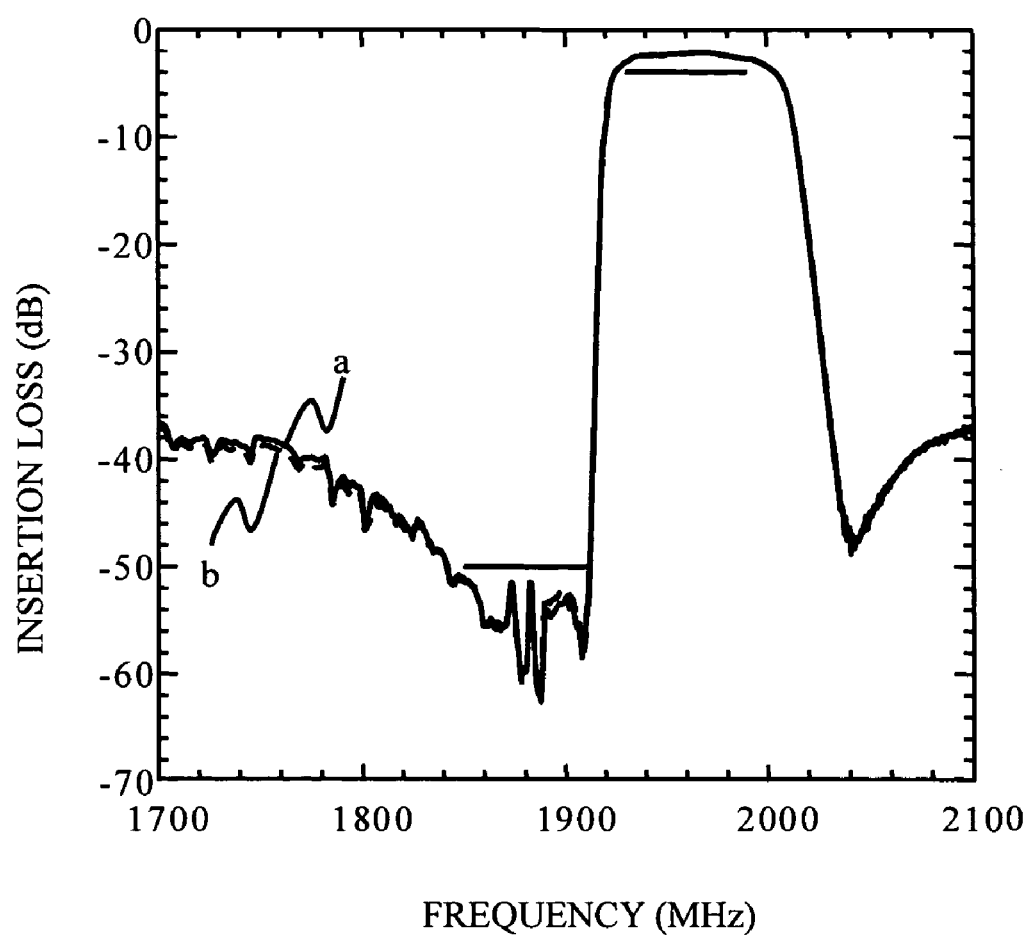
FIG. 8 shows a comparison of the insertion loss characteristics between the duplexer of the present invention and the conventional duplexer.

FIG. 8 shows a comparison of the insertion loss characteristics between the duplexer 100 of the present invention and the conventional duplexer. The duplexer 100 of the present invention includes the ground patterns 143a through 143d provided between the matching line pattern for signal reception and the matching line pattern, as shown in FIGS. 5F and 5H.

The ground patterns 143a through 143d are provided between the matching line pattern 142 for signal reception and the first and second matching line patterns 132 and 133, in accordance with the present invention, and the isolation is thus enhanced and the suppression is improved. Similarly, a ground pattern is provided between a signal line for signal transmission and the first and second matching line patterns 132 and 133, and the isolation can be enhanced and the suppression can be improved.

Figure 9:
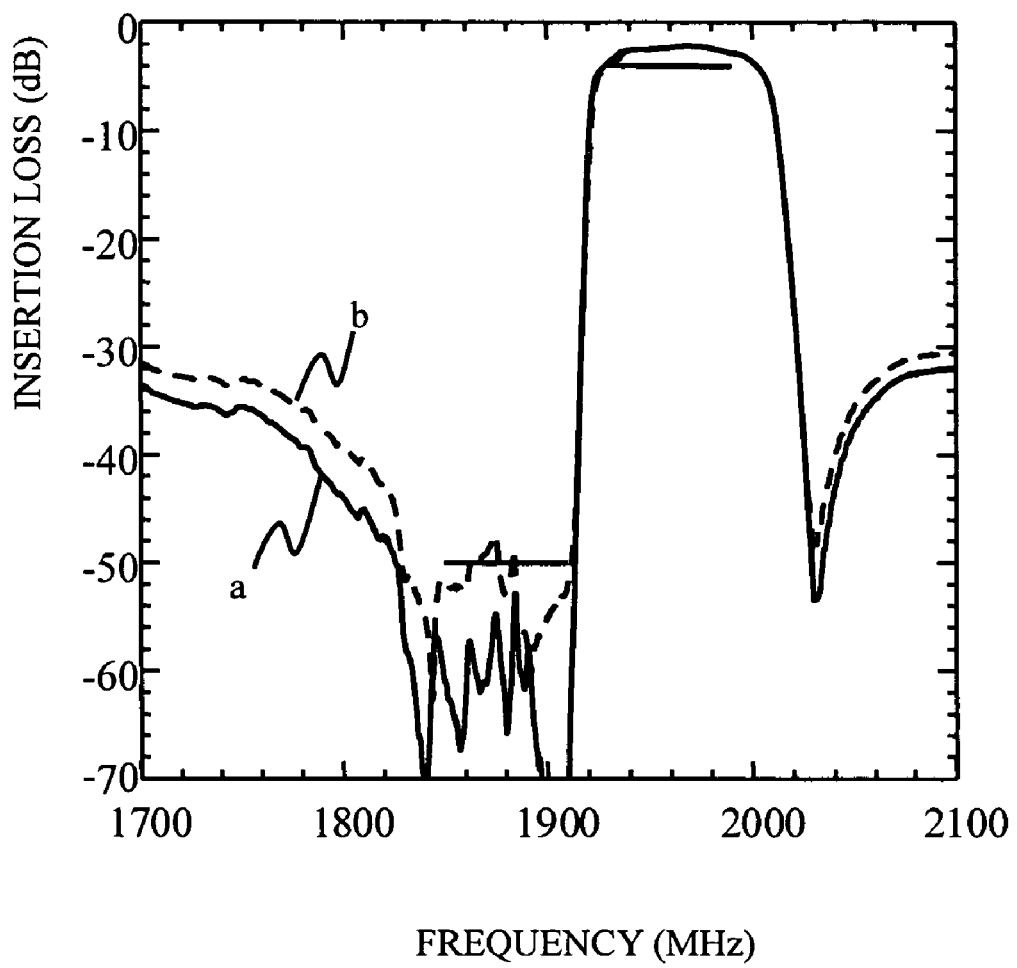
FIG. 9 is a graph illustrating the effects of the ground vias to connect the "sheet-like grounds" that sandwich a matching line pattern from top and bottom.

FIG. 9 is a graph illustrating the effects of the ground vias $141_7$ through $141_{16}$ to connect the "sheet-like grounds" that sandwich the matching line pattern from top and bottom. The ground vias $141_7$ through $141_{16}$ connect the "sheet-like ground" on the die attach layer 124 and the "sheet-like ground" on the footpads 131. In other words, FIG. 9 is a graph illustrating the difference in the insertion loss characteristics between the duplexers having and not having the ground vias.

As is obvious from FIG. 9, the isolation between signals is enhanced and the suppression is improved, by providing the ground vias that connect the sheet-like grounds sandwiching the matching line pattern from top and bottom. Additionally, the ground vias can provide protection against the connection between the signal lines not only on the layers having the ground vias such as the matching line pattern layer 125, the ground layer 126, and the matching pattern line layer/the footpad layer 127 but also on the layers arranged above and below.

Referring back to FIGS. 5F and 5H, the ground pattern and the ground vias are arranged to surround the signal lines for signal transmission and those for signal reception, and a space can be retained so that the first matching line pattern 132 and the second matching line pattern 133 may be arranged inside the respective layers. It is thus possible to prevent the self-connection of the matching line pattern, and thereby enhance the inductance of the matching line pattern effectively.

Figure 10:
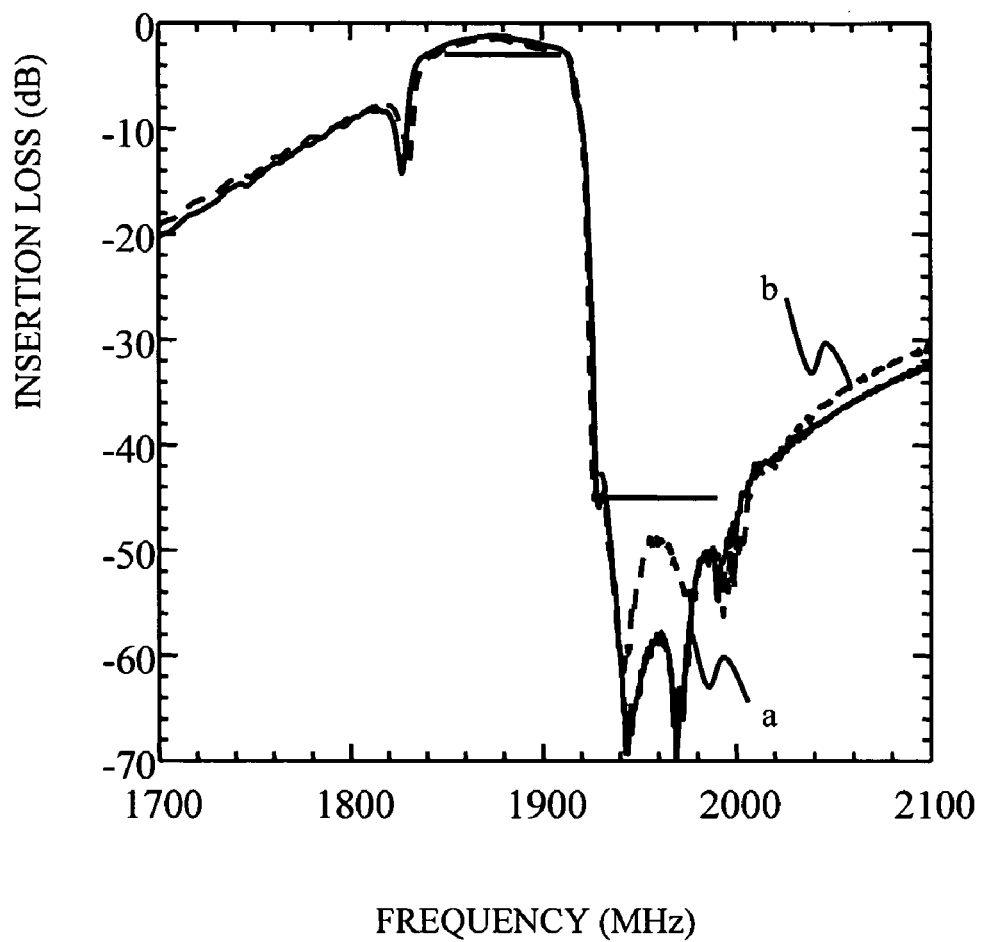
FIG. 10 is a graph illustrating the effects of a case where the wire bonding pad (transmission ground) is connected to the wire bonding pad (reception ground)

FIG. 10 is a graph illustrating the effects of a case where the transmission ground (the ground wire bonding pad 139a1 for signal transmission) is connected to the reception ground (the ground wire bonding pad 139b1 for signal reception). As shown in FIG. 5B, the duplexer of the present invention is configured to connect only the ground wire bonding pad 139a1 for signal transmission and the ground wire bonding pad 139b1 for signal reception on the wire bonding pad layer 122. The common inductance is optimized and the suppression is improved.

Referring back to FIG. 3, the distances are substantially equal between the adjacent ground patterns of the three ground patterns 134a through 134c on the duplexer 100. That is to say, a distance between the ground pattern 134a and the ground pattern 134b is substantially equal to a distance between the ground pattern 134b and the ground pattern 134c. A description will be given of a variation of the embodiment of the present invention. Particular effects are obtainable by configuring the distances to be different.

Figure 11:
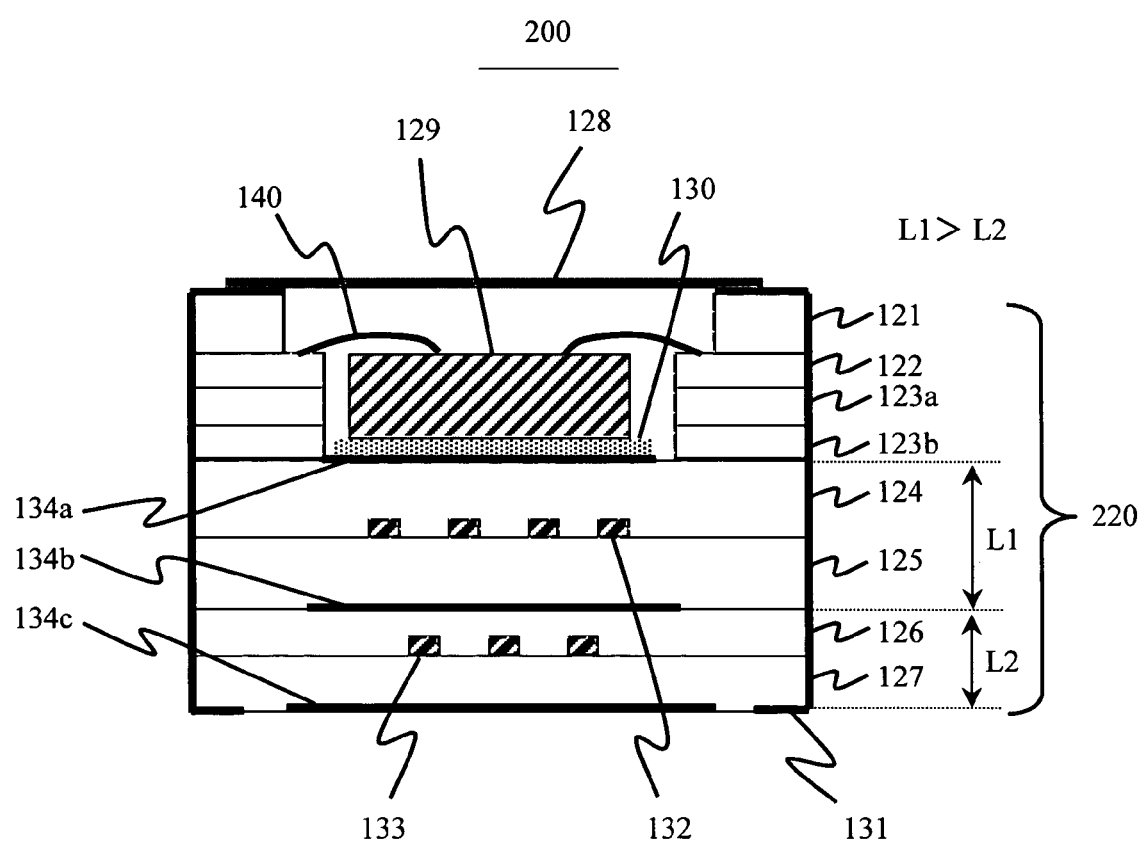
FIG. 11 is a cross-sectional view of another duplexer, which is a variation of the present embodiment in accordance with the present invention.

FIG. 11 is a cross-sectional view of a duplexer 200, which is a variation of the present embodiment in accordance with the present invention. Hereinafter, in the following description, the same components and configurations have the same reference numerals as described. The duplexer 200 includes a laminated package 220, the filter chip 129, the first matching line pattern 132, the second matching line pattern 133, and the cap 128. The laminated package 220 includes the above-mentioned eight layers 121 through 127 as shown in FIG. 11. The first matching line pattern 132 is provided on the matching line pattern layer 125. The second matching line pattern 133 is provided on the matching line pattern layer/the footpad layer 127. The first matching line pattern 132 is connected in series with the second matching line pattern 133. This can make it possible to obtain the inductance necessary for matching the phase.

Preferably, the ground patterns 134a, 134b and 134c are required to sandwich the matching line patterns in order to obtain a stable characteristic impedance of the line for phase matching. As the ground patterns 134a and 134b are configured to be further from the footpads 131 in a direction of height, the ground patterns 134a and 134b have inductances higher than that of the ground pattern 134c of the footpads 131, and the characteristic impedance varies more. This variation becomes smaller as the distances are configured to be smaller between the ground patterns 134a through 134c provided above and below the first and second matching lines 132 and 133.

As shown in FIG. 11, the duplexer 200 has the laminated structure having the die attach layer 124, the matching line pattern layer 125, the ground layer 126, and the matching line pattern layer/the footpad layer 127. The die attach layer 124 is a first ground layer on which the ground pattern 134a is provided. The matching line pattern layer 125 has the first matching line pattern 132 thereon that serves as the phase matching circuit. The ground layer 126 is a second ground layer. The matching line pattern layer/the footpad layer 127 is a third ground layer. An upper ground distance L1 denotes the distance between the first ground pattern 134a and the second ground pattern 134b. A lower ground distance L2 denotes the distance between the second ground pattern 134b and the third ground pattern 134c. The duplexer 200 is configured so that the upper ground distance L1 may be larger than the lower ground distance L2 (L1>L2). Thus provided ground patterns can improve the impedances of the first and second matching line patterns 132 and 133.

Figure 12A:
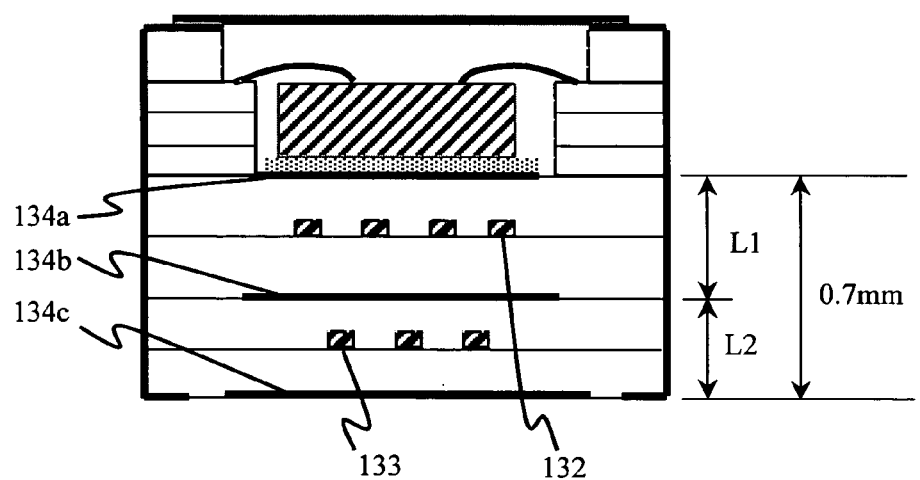
FIGS. 12A and 12B are views describing reflection coefficients of transmission bands in which the matching line patterns have different characteristic impedances.
Figure 12B:
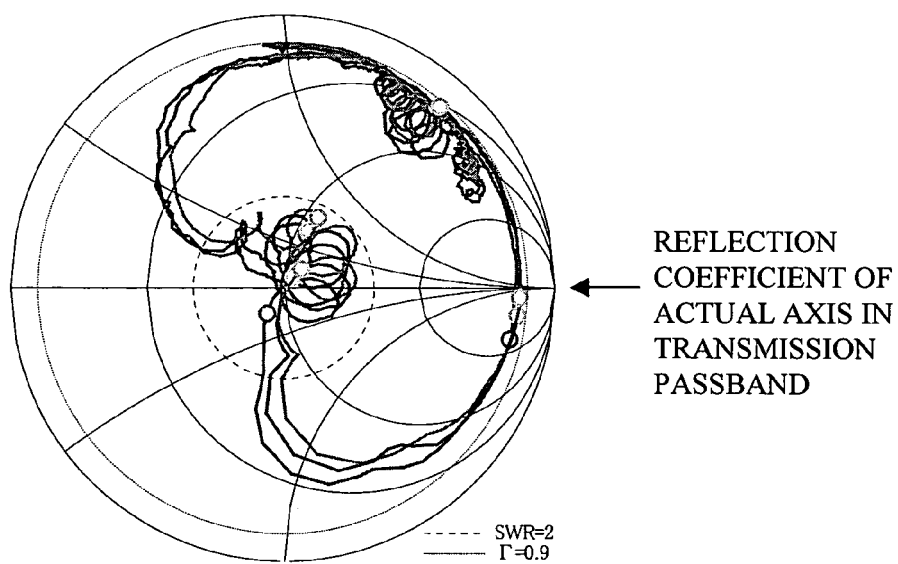

FIGS. 12A and 12B are views describing the reflection coefficients of the transmission bands in which the matching line patterns have different characteristic impedances. Referring to FIG. 12A, the upper ground distance L1 plus the distance L2 has a constant value of 0.7 mm. The lower ground distance L1 plus the distance L2 denotes the distance from the first ground pattern 134a to the ground pattern 134c. Referring to Table 1 below, Table 1 shows variations of the upper and lower ground distances L1 and L2.

TABLE 1

|  | Package A | Package B | Package C |
| --- | --- | --- | --- |
| L1 | 0.325 mm | 0.350 mm | 0.375 mm |
| L2 | 0.375 mm | 0.350 mm | 0.325 mm |

Thus varied upper ground distance L1 and lower ground distance L2 also vary the characteristic impedances. FIG. 12B shows the reflection characteristics measured on the common terminal in the package on which only the reception filter is mounted. As the upper ground distance L1 is configured longer, the reflection characteristics shift toward infinite impedance. This tells that the matching line pattern has higher characteristic impedance.

Figure 13:
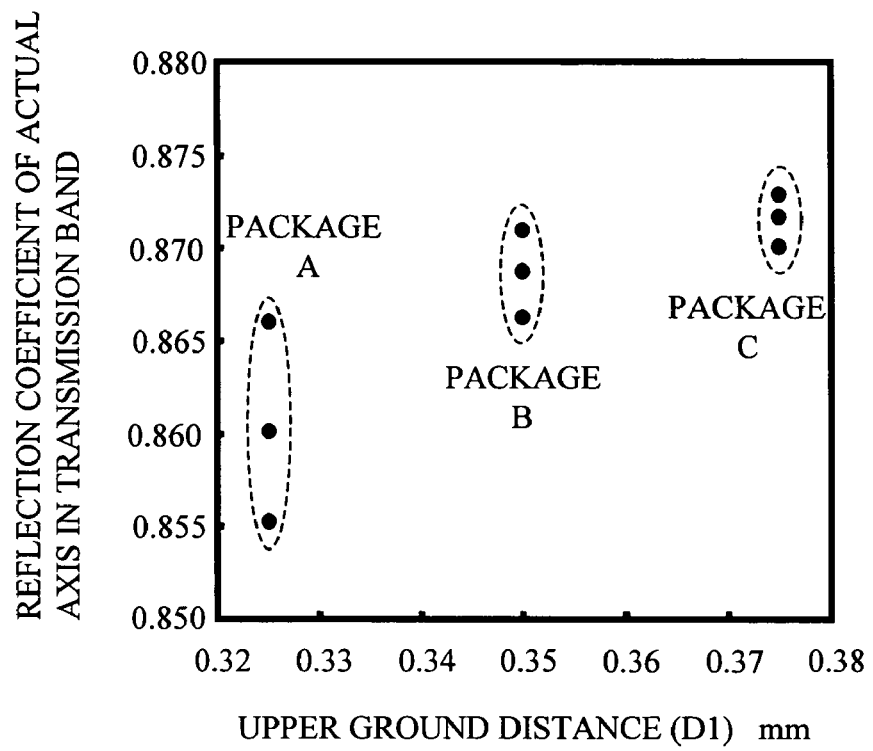
FIG. 13 is a graph showing how the reflection coefficient on a real axis of the transmission bands depends on an upper ground distance.

FIG. 13 is a graph showing how the reflection coefficient on a real axis of the transmission bands depends on the upper ground distance L1. The vertical axis denotes the reflection coefficient. As shown in FIG. 13, as the upper ground distance L1 becomes longer, the reflection coefficient becomes larger and the power durability is improved. The downsized package, as compared to the conventional one, does not have an enough space to provide the matching line pattern for signal reception. Therefore, there is a problem in that the matching line pattern causes a self-resonance and the reflection coefficient becomes small drastically. The aforementioned problem can be thus solved with the duplexer of the present invention.

Figure 14:
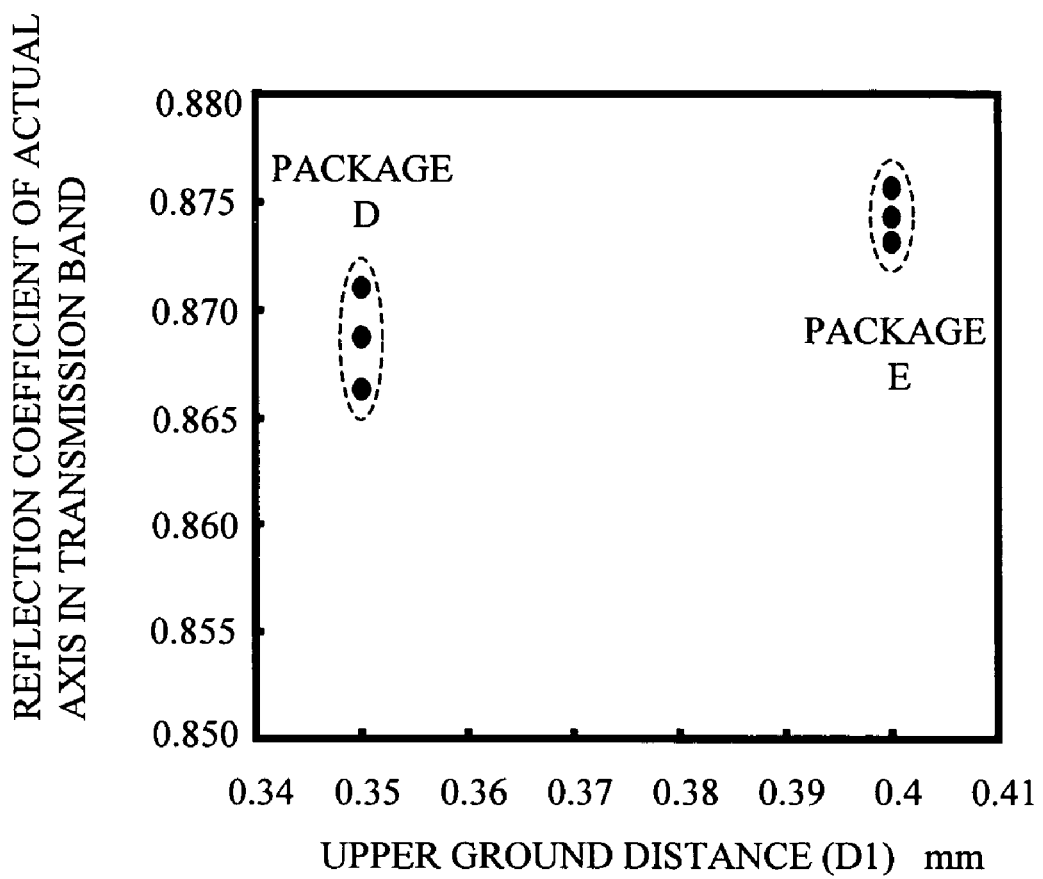
FIG. 14 is a graph showing a comparison result of the reflection coefficient in the transmission bands.
Figure 15:
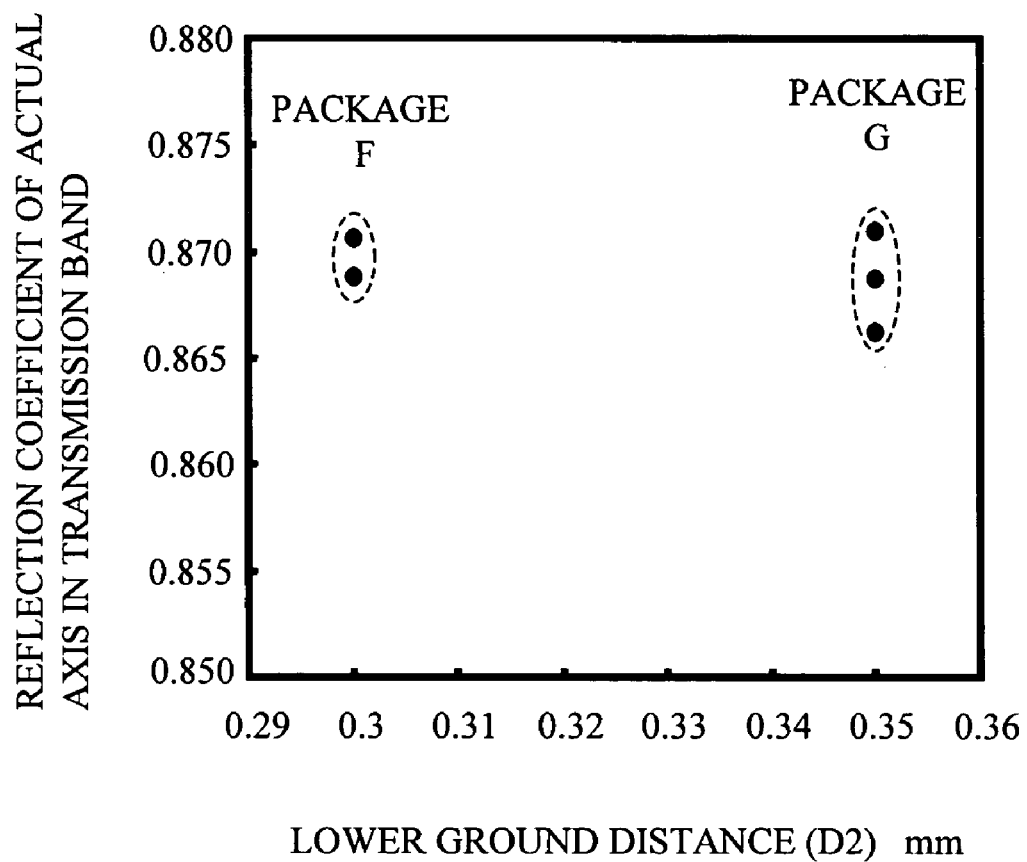
FIG. 15 is another graph showing the comparison result of the reflection coefficient in the transmission bands.

FIG. 14 is a graph showing a comparison result of the reflection coefficient in the transmission band. Here, the lower ground distance L2 is constant, while the upper ground distance L1 is varied as shown in Table 2 below. FIG. 15 is another graph showing the comparison result of the reflection coefficient in the transmission band. The upper ground distance L1 is constant, while the lower ground distance L2 is varied as shown in Table 3 below.

TABLE 2

|    | Package D | Package E |
|----|-----------|-----------|
| L1 | 0.350 mm  | 0.400 mm  |
| L2 | 0.350 mm  | 0.350 mm  |

TABLE 3

|    | Package D | Package E |
|----|-----------|-----------|
| L1 | 0.350 mm  | 0.350 mm  |
| L2 | 0.350 mm  | 0.300 mm  |

FIGS. 14 and 15 demonstrate that when the upper ground distance L1 is longer, it is more effective to obtain the larger reflection coefficient. When the lower ground distance L2 is longer, it is not effective.

With the duplexer of the present invention, the first matching line pattern 132 is configured to be longer than the second matching line pattern 133 so that the reflection coefficient can be larger in the transmission band.

Figure 16A:
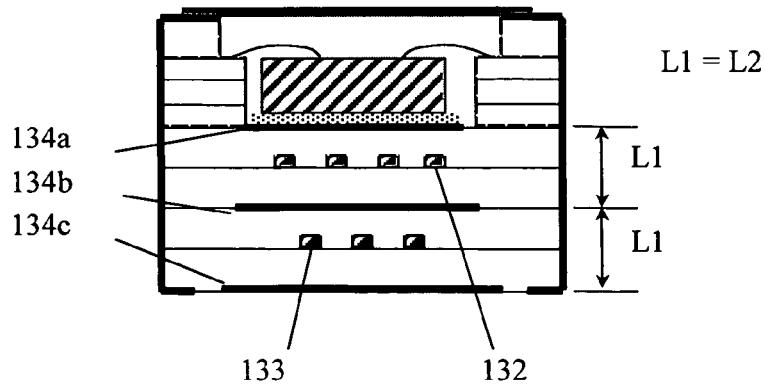
FIGS. 16A through 16C describe the effects of the duplexer having a first matching line pattern provided on an upper layer is longer than a second matching line pattern provided on a lower layer.
Figure 16B:
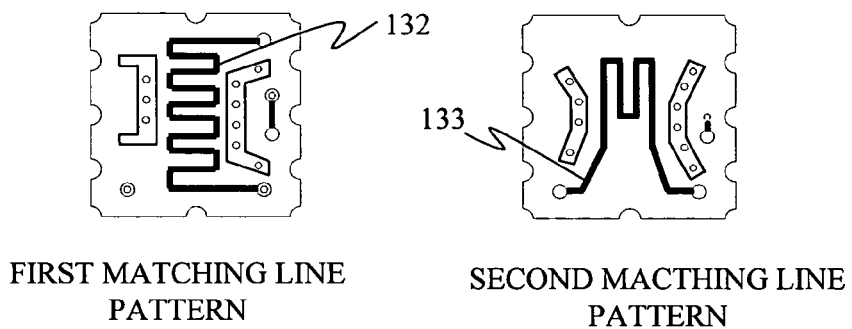
Figure 16C:
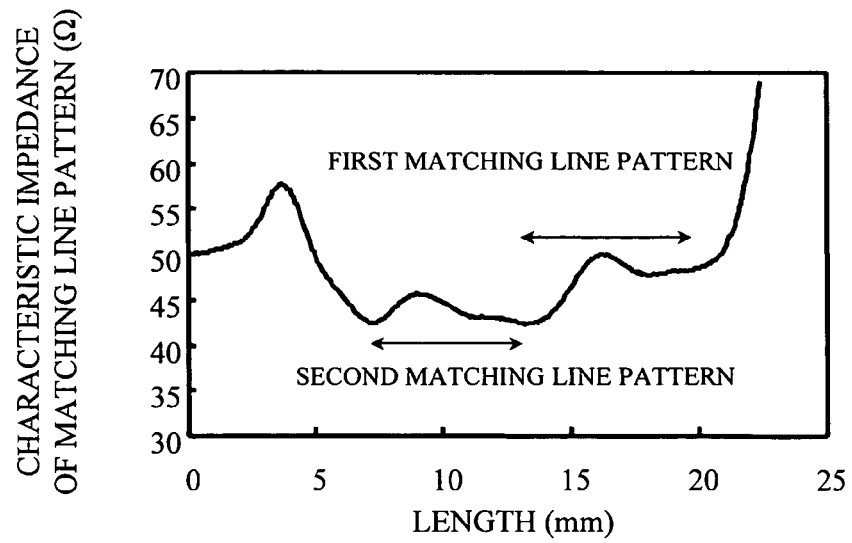

FIGS. 16A through 16C describe the effects of the duplexer having the first matching line pattern 132 provided on the upper layer is longer than the second matching line pattern 133 provided on the lower layer. FIG. 16A is a cross-sectional view of the duplexer including the upper and lower ground distances D1 and D2 having an equal length. FIG. 16B shows the first matching line pattern 132 provided on the matching line pattern layer 125 and the second matching line pattern 133 provided on matching pattern line layer/the footpad layer 127. FIG. 16C is a graph describing the characteristic impedance varied depending on the distances between the lines for phase matching, namely, the strip line. The horizontal axis denotes the length of the strip line. The vertical axis denotes the characteristic impedance.

Referring to FIG. 16C, even when the upper ground distance L1 has the same length as the lower ground distance l2, the first matching line pattern 132 has a higher characteristic impedance than that of the second matching line pattern 133. Therefore, the first matching line pattern 132 having the higher characteristic impedance is configured to be longer than the second matching line pattern 133, and thereby the characteristic impedance totally becomes higher. It is thus possible to obtain the higher reflection coefficient and thereby the power durability is enhanced.

Figure 17A:
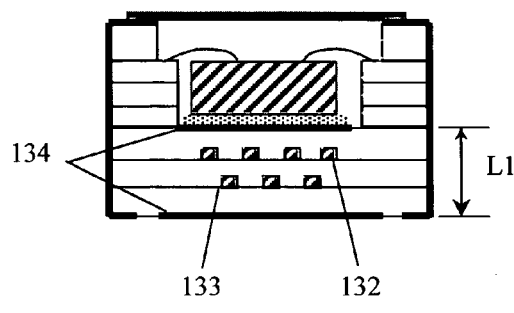
FIGS. 17A through 17D show the effects of the "sheet-like ground"
Figure 17B:
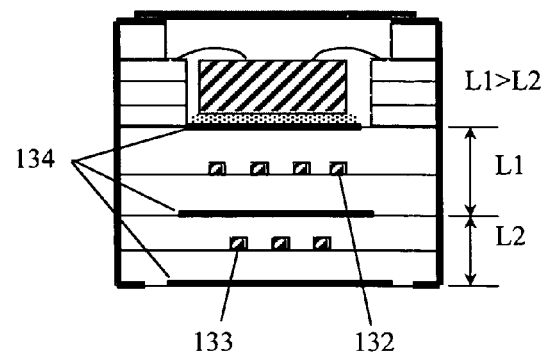
Figure 17C:
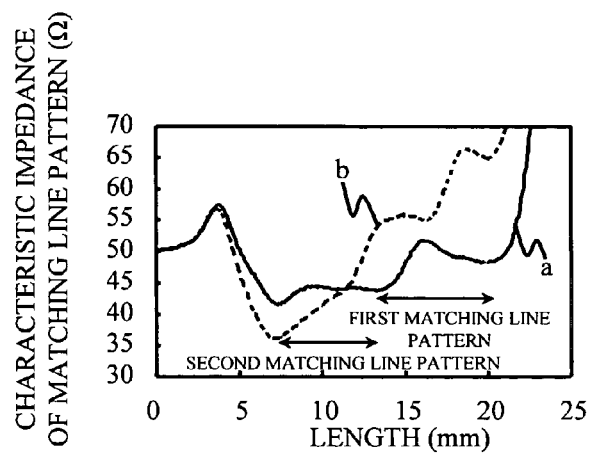
Figure 17D:
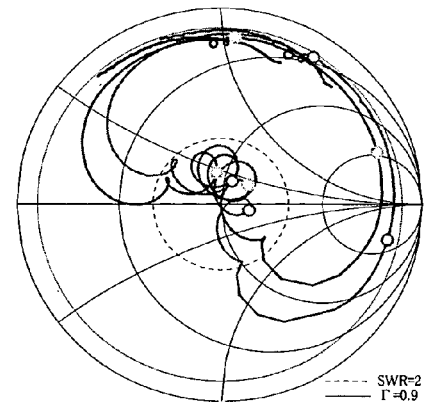

The duplexer in accordance with the present invention is configured to include the "sheet-like ground" 134b arranged between the first matching line pattern 132 and the second matching line pattern 133 so that the reflection coefficient is larger in the transmission band. FIGS. 17A through 17D show the effects of the aforementioned "sheet-like ground". FIG. 17A is a cross-sectional view of the duplexer including the "sheet-like ground" 134b arranged between the first matching line pattern 132 and the second matching line pattern 133. FIG. 17B is a cross-sectional view of the duplexer without the "sheet-like ground". FIG. 17C is a graph showing the characteristic impedance varied depending on the distances between the lines for phase matching (the strip line) of the duplexers with and without the sheet-like ground. The horizontal axis denotes the length of the strip line. The vertical axis denotes the characteristic impedance. FIG. 17D shows the reflection characteristics measured on the common terminal in the package having only the reception filter.

Referring to FIGS. 17C and 17D, the "sheet-like ground" is not arranged between the first matching line pattern 132 and the second matching line pattern 133, and the characteristic impedance drastically varies depending on the self-connection of the first and second matching line patterns. Besides, the reflection coefficient becomes smaller. In contrast, the duplexer of the present invention includes the "sheet-like ground" 134b arranged between the first matching line pattern 132 and the second matching line pattern 133, and this suppresses the variations of the characteristic impedance due to the self-connection. Moreover, the reflection coefficient is larger.

The duplexer of the present invention includes three "sheet-like grounds" 134a, 134b, and 134c, which are alternately arranged to sandwich the first and second matching line patterns. The sheet-like ground 134a having a smallest area is provided on the upper layer above the first matching line pattern 132. This can improve the characteristic impedance of the first matching line pattern 132.

Figure 18A:
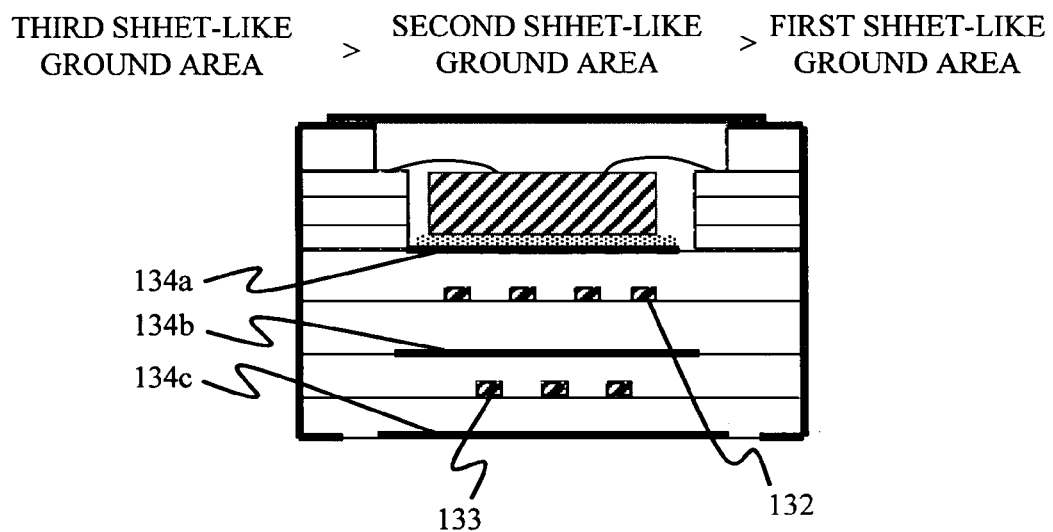
FIGS. 18A and 18B show the characteristic impedance varied depending on the distances between the matching lines (a strip line) of the duplexer in accordance with the present invention.
Figure 18B:
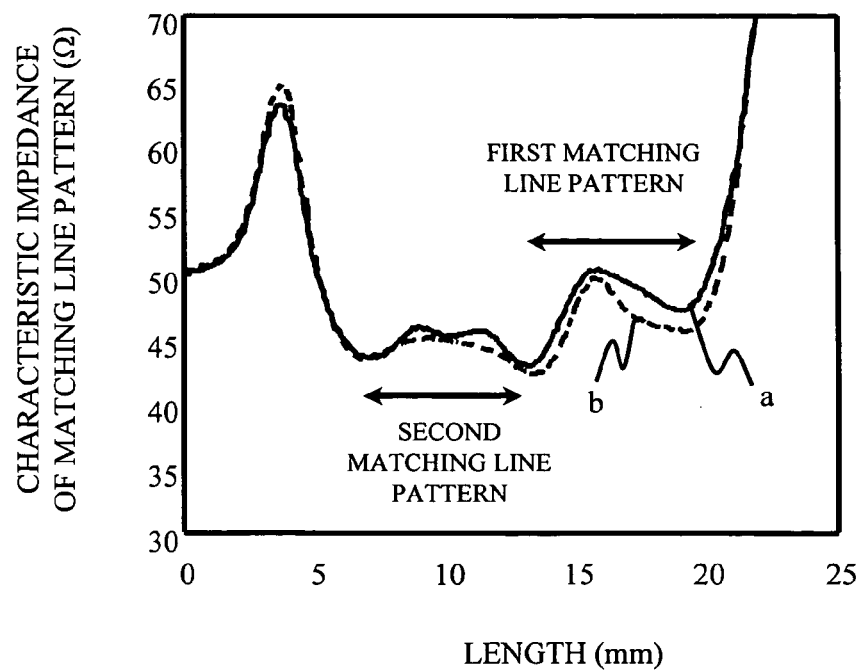

FIG. 18A is a cross-sectional view of the duplexer of the present invention including three "sheet-like grounds" having areas S1, S2, and S3. The sheet-like ground 134a has the smallest area S1. The sheet-like ground 134b has the area S2. The sheet-like ground 134c has the largest area S3. Here, S1<S2<S3. FIG. 18B shows the characteristic impedance varied depending on the distances between the lines for phase matching (the strip line) of the aforementioned duplexer. The horizontal axis denotes the length of the strip line. The vertical axis denotes the characteristic impedance. FIG. 18B shows the characteristic impedance of the duplexer shown in FIG. 18A, and also shows that of another duplexer having the area S1 almost equal to the area S2, while the areas S1 and S3 are the same as those shown in FIG. 8A.

As shown in FIGS. 18A and 18B, the area S1 of the first sheet-like ground 134a is configured smallest, and thereby the capacitance of the first matching line pattern 132 can be small and the characteristic impedance can be improved. Additionally, this results in the larger reflection coefficient in the transmission band and thereby the power durability is enhanced. Thus configured areas of the sheet-like grounds are capable of increase the characteristic impedance of the matching line patterns without increasing the height of the device. This is significantly effective for reducing the height of the device. If the area S2 of the sheet-like ground 134b is configured smallest of the three areas S1, S2, and S3, the self-connection might occur between the first matching line pattern 132 and the second matching line pattern 133 and this cannot be an effective solution. The area S3 is configured largest on the duplexer in accordance with the present invention so that the duplexer can have a high tolerance for noise from the outside.

Figure 19:
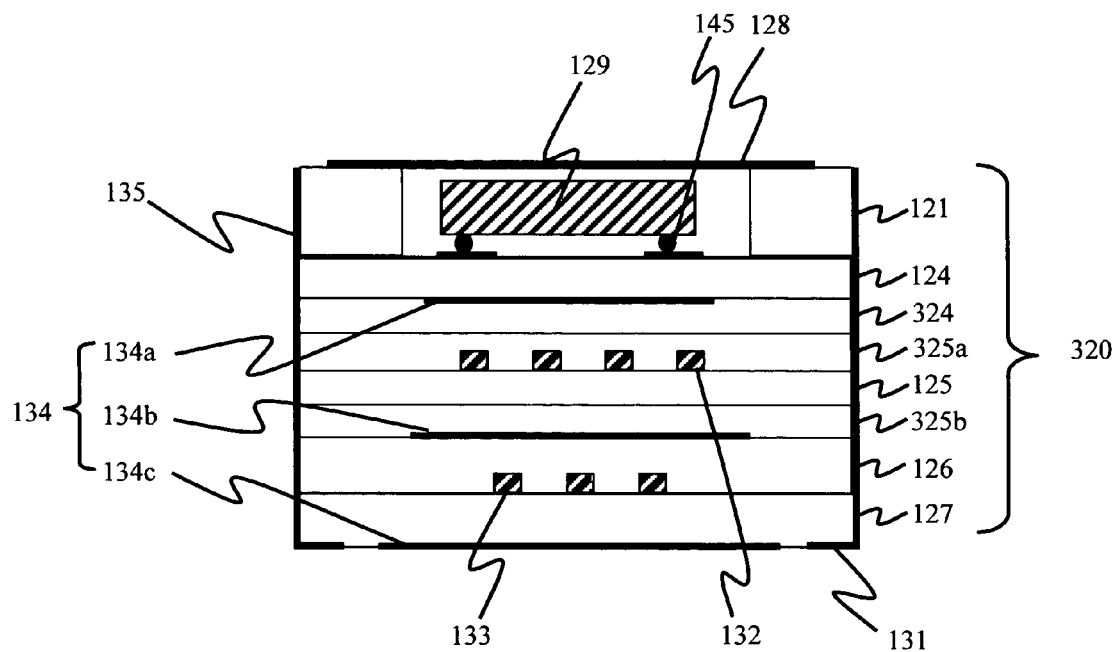
FIG. 19 is a cross-sectional view of the duplexer of the present invention including a chip connected to a laminated package by bumps, and is mounted in a face-down state (flip-chip mounting)

The description has been given of the duplexer of the present invention in which the chip and the package are connected by wires. A duplexer 300, however, shown in FIG. 19 may include the chip 129 that is connected to a laminated package 320 by bumps 145. The chip 129 is mounted in a face-down state (flip-chip mounting). In this case, the matching line pattern for signal reception may be provided on newly arranged matching line pattern layers 325a and 325b for signal reception, instead of the matching line pattern layer 125. In FIG. 19, a ground layer 324 is provided immediately below the die attach layer 324.

Figure 20:
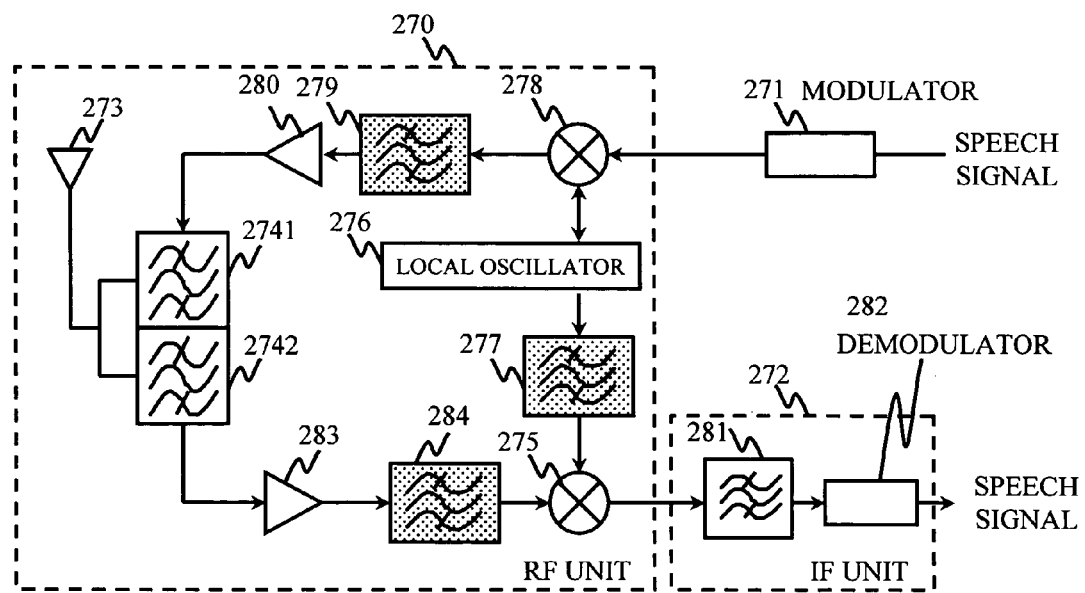
FIG. 20 is a block diagram of an electronic device including the duplexer in accordance with the present invention.

FIG. 20 is a block diagram of an electronic device including either the duplexer 100 or 200. A description will now be given of a high-frequency device mounted on a mobile telephone, as an example. Other components such as a speech processing system on the mobile telephone are omitted, for simplification.

The mobile telephone includes an RF unit 270, a modulator 271, and an IF (intermediate frequency) unit 272. The RF unit 270 includes an antenna 273, a duplexer 274, a low noise amplifier 283, an interstage filter 284, a mixer (multiplier) 275, a local oscillator 276, another interstage filter 277, another mixer (multiplier) 278, another interstage filter 279, and a power amplifier 280. A speech signal from the speech processing system is modulated on the modulator 271, and a frequency thereof is converted (mixed) on the mixer 278 of the RF unit 270 with an oscillation signal of the local oscillator 276. An output from the mixer 278 passes through the interstage filter 279 and the power amplifier 280, and is applied to the duplexer 274.

The duplexer 274 includes a transmission filter $274_1$, a reception filter $274_2$, and the duplexer 100 or 200 having the phase matching circuit, which is not shown. The transmission signal from the power amplifier 280 is fed to the duplexer 274 through the antenna 273. The reception signal from the antenna 273 passes through the reception filter $274_2$ of the duplexer 274, the low noise amplifier 283, and the interstage filter 284, and is applied to the mixer 275. The mixer 275 receives an oscillation frequency of the local oscillator 276 via the interstage filter 277, converts the frequency of the reception signal, and outputs the signal into the IF unit 272. The IF unit 272 receives the signal via an IF filter 281, demodulates the signal with a demodulator 282, and outputs the demodulated speech signal into the speech processing system that is not shown.

The electronic device shown in FIG. 20 is a communication device having the duplexer of the present invention. It is thus possible to provide the small-sized communication device having excellent filter characteristics.

The present invention is not limited to the above-mentioned embodiments, and other embodiments, variations and modifications may be made without departing from the scope of the present invention.

The present invention is based on Japanese Patent Application No. 2004-132126 filed on Apr. 27, 2004, the entire disclosure of which is hereby incorporated by reference.

What is claimed is:

1. An antenna duplexer comprising:
   two surface acoustic wave filters having different center frequencies;
   a phase matching circuit that matches phases of the two surface acoustic wave filters; and
   a multilayered package housing the two surface acoustic wave filters,
   wherein:
   the multilayered package has multiple layers including a bonding layer having wire bonding pads for making connections with the two surface acoustic wave filters and wiring patterns extending from the wire bonding pads;
   at least two of the multiple layers having a matching line pattern provided between the two surface acoustic wave filters and/or transmission and reception terminals;
   each of the at least two of the multiple layers having a ground pattern that defines an area in which the matching line pattern is provided, and
   the matching line pattern including nothing of the wiring patterns extending from the wire bonding pads in the bonding layer.

2. The antenna duplexer as claimed in claim 1, wherein the matching line pattern has no portion provided on one of the multiple layers that is arranged immediately below the bonding layer.

3. The antenna duplexer as claimed in claim 1, wherein:
   the matching line pattern is provided on at least three layers among the multiple layers; and
   the multilayered package has no sheet-like ground interposed between portions of the matching line pattern provided on the at least three layers.

4. The antenna duplexer recited in claim 1,
   wherein a ground pattern is provided between the matching line pattern and the phase matching circuit.

5. The antenna duplexer as claimed in claim 4, wherein the ground pattern is connected through multiple ground vias.

6. The antenna duplexer recited in claim 1, wherein the multilayered package includes grounds respectively provided for the first and second filters, and the grounds are connected on the bonding layer.

7. The antenna duplexer recited in claim 1,
   wherein:
   the multilayered package comprises a first pattern layer, a second pattern layer, a first ground layer, a second ground layer, and a third ground layer, the first pattern layer having thereon a first matching line pattern that forms the phase matching circuit, the second pattern layer having thereon a second matching line pattern that forms the phase matching circuit and being arranged below the first pattern layer, the first ground layer being arranged above the first pattern layer, the second ground layer being arranged between the first and the second pattern layers, the third ground layer being arranged below the second pattern layer;
   the first through the third ground layers respectively have ground patterns thereon; and
   the first matching line pattern is longer than the second matching line pattern.

8. The antenna duplexer as claimed in claim 7, wherein the ground patterns are sheet-like grounds.

9. The antenna duplexer as claimed in claim 8, wherein the ground pattern provided on the first ground layer has a smallest area.

10. The antenna duplexer as claimed in claim 9, wherein the ground pattern provided on the third ground layer has a largest area.

11. An antenna duplexer comprising:
   a first and a second surface acoustic wave filters having different center frequencies;
   a phase matching circuit that matches phases of the two surface acoustic wave filters; and
   a multilayered package,
   wherein:
   the multilayered package comprises a first pattern layer, a second pattern layer, a first ground layer, a second ground layer, and a third ground layer, the first pattern layer having thereon a first matching line pattern that forms the phase matching circuit, the second pattern layer having thereon a second matching line pattern that forms the phase matching circuit and being arranged below the first pattern layer, the first ground layer being arranged above the first pattern layer, the second ground layer being arranged between the first and the second pattern layers, the third ground layer being arranged below the second pattern layer;

the first through the third ground layers respectively have ground patterns thereon; and a first distance between the ground pattern on the first ground layer and the ground pattern on the second ground layer is longer than a second distance between the ground pattern on the second ground layer and the ground pattern on the third ground layer.

12. The antenna duplexer as claimed in claim 11, wherein the ground patterns are sheet-like grounds.

13. The antenna duplexer as claimed in claim 12, wherein the ground pattern provided on the first ground layer has a smallest area.

14. The antenna duplexer as claimed in claim 13, wherein the ground pattern provided on the third ground layer has a largest area.

15. An electronic device comprising:
   an antenna;
   an antenna duplexer connected to the antenna;
   circuits for signal transmission and reception connected to the antenna duplexer; and
   the antenna duplexer comprising:
   two surface acoustic wave filters having different center frequencies;
   a phase matching circuit that matches phases of the two surface acoustic wave filters; and
   a multilayered package housing the two surface acoustic wave filters;
   wherein:
   the multilayered package has multiple layers including a bonding layer having wire bonding pads for making connections with the two surface acoustic wave filters and wiring patterns extending from the wire bonding pads;
   at least two of the multiple layers having a matching line pattern provided between the two surface acoustic wave filters and transmission and/or reception terminals;
   each of the at least two of the multiple layers having a ground pattern that defines an area in which the matching line pattern is provided, and
   the matching line pattern including nothing of the wiring patterns extending from the wire bonding pads in the bonding layer.

* * * * *